(12) United States Patent
Huang

(10) Patent No.: US 12,274,052 B2
(45) Date of Patent: *Apr. 8, 2025

(54) SEMICONDUCTOR DEVICE WITH VANADIUM-CONTAINING SPACERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 177 days.

This patent is subject to a terminal disclaimer.

(21) Appl. No.: 18/195,512

(22) Filed: May 10, 2023

(65) Prior Publication Data
US 2024/0008264 A1    Jan. 4, 2024

Related U.S. Application Data

(62) Division of application No. 17/855,952, filed on Jul. 1, 2022.

(51) Int. Cl.
*H10B 12/00*    (2023.01)
*H10D 64/01*    (2025.01)

(52) U.S. Cl.
CPC ......... *H10B 12/482* (2023.02); *H10B 12/485* (2023.02); *H10B 12/50* (2023.02); *H10D 64/021* (2025.01)

(58) Field of Classification Search
CPC .......................... H10B 12/482; H01L 29/6656
See application file for complete search history.

(56) References Cited

U.S. PATENT DOCUMENTS

| | | | |
|---|---|---|---|
| 2016/0086882 A1 | 3/2016 | Lee et al. | |
| 2017/0309476 A1* | 10/2017 | Venkatasubramanian | ................... H01L 21/02205 |
| 2022/0173108 A1* | 6/2022 | Lee | ................... H01L 23/53266 |
| 2024/0008262 A1* | 1/2024 | Huang | ................... H10B 12/09 |

FOREIGN PATENT DOCUMENTS

| | | |
|---|---|---|
| CN | 103137645 A | 6/2013 |
| CN | 103383935 A | 11/2013 |
| CN | 112582417 A | 3/2021 |

OTHER PUBLICATIONS

Office Action and and the search report mailed on Nov. 17, 2023 related to Taiwanese Application No. 111147746.
Office Action and and the search report mailed on Feb. 22, 2024 related to Taiwanese Application No. 112140910.

* cited by examiner

*Primary Examiner* — John P. Dulka
(74) *Attorney, Agent, or Firm* — Xuan Zhang

(57) ABSTRACT

The present application discloses a semiconductor device and a method for fabricating the semiconductor device. The semiconductor device includes a substrate; a bit line structure positioned on the substrate; a plurality of first bit line spacers positioned on sidewalls of the bit line structure; a plurality of second bit line spacers positioned on the plurality of first bit line spacers. The plurality of first bit line spacers include one or more species of vanadium oxide. The plurality of second bit line spacers include silicon nitride, silicon nitride oxide, or silicon oxynitride.

17 Claims, 29 Drawing Sheets

SEMICONDUCTOR DEVICE WITH VANADIUM-CONTAINING SPACERS AND METHOD FOR FABRICATING THE SAME

CROSS-REFERENCE TO RELATED APPLICATION

This application is a divisional application of U.S. Non-Provisional application Ser. No. 17/855,952 filed 1 Jul. 2022, which is incorporated herein by reference in its entirety.

TECHNICAL FIELD

The present disclosure relates to a semiconductor device and a method for fabricating the semiconductor device, and more particularly, to a semiconductor device with and a method for fabricating the semiconductor device with the vanadium-containing spacers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a bit line structure positioned on the substrate; a plurality of first bit line spacers positioned on sidewalls of the bit line structure; a plurality of second bit line spacers positioned on the plurality of first bit line spacers. The plurality of first bit line spacers include one or more species of vanadium oxide. The plurality of second bit line spacers include silicon nitride, silicon nitride oxide, or silicon oxynitride.

Another aspect of the present disclosure provides a semiconductor device including a substrate including an array region and a peripheral region surrounding the array region; a bit line structure positioned on the array region; a peripheral gate structure positioned on the peripheral region; a plurality of first bit line spacers positioned on sidewalls of the bit line structure and a plurality of first peripheral gate spacers positioned on sidewalls of the peripheral gate structure; and a plurality of second bit line spacers positioned on the plurality of first bit line spacers and a plurality of second peripheral gate spacers positioned on the plurality of first peripheral gate spacers. The plurality of first bit line spacers and the plurality of first peripheral gate spacers include one or more species of vanadium oxide. The plurality of second bit line spacers and the plurality of second peripheral gate spacers include silicon nitride, silicon nitride oxide, or silicon oxynitride.

Another aspect of the present disclosure provides a method for fabricating a semiconductor device including providing a substrate including an array region and a peripheral region surrounding the array region; forming a bit line structure on the array region and forming a peripheral gate structure on the peripheral region; forming a plurality of first bit line spacers on sidewalls of the bit line structure and forming a plurality of first peripheral gate spacers on sidewalls of the peripheral gate structure; and forming a plurality of second bit line spacers on the plurality of first bit line spacers and forming a plurality of second peripheral gate spacers on the plurality of first peripheral gate spacers. The plurality of first bit line spacers and the plurality of first peripheral gate spacers include one or more species of vanadium oxide. The plurality of second bit line spacers and the plurality of second peripheral gate spacers include silicon nitride, silicon nitride oxide, or silicon oxynitride.

Due to the design of the semiconductor device of the present disclosure, the parasitic capacitance between adjacent bit line structures may be reduced due to the employment of the plurality of first bit line vanadium-containing spacers. As a result, the performance of the semiconductor device may be improved. In addition, the layers of the bit line structure and the layers of peripheral gate structure may be concurrently formed to reduce the complexity and time for fabricating the semiconductor device. As a result, the cost of fabrication of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
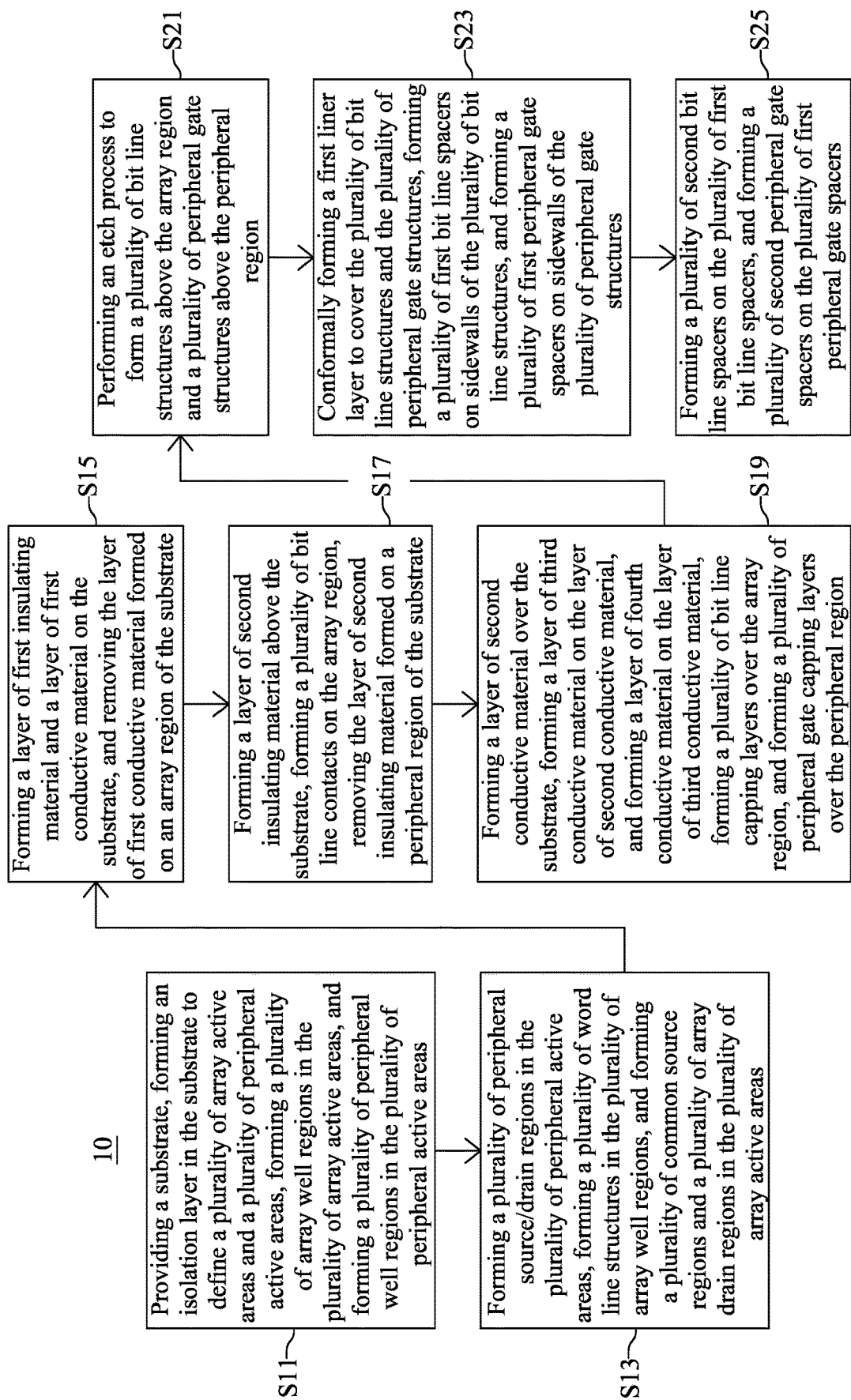
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
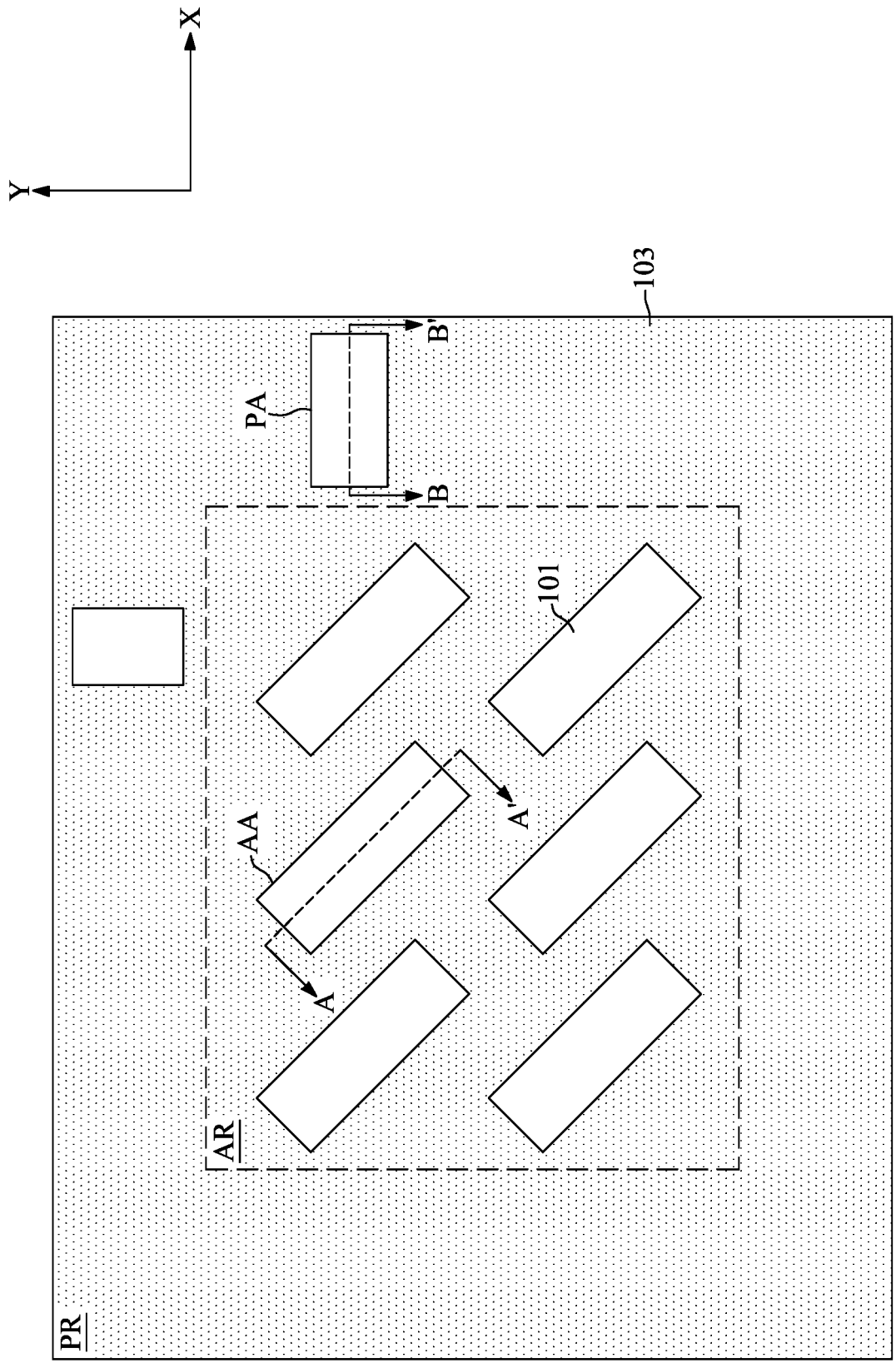
FIG. 2 illustrates, in a schematic top-view diagram, an intermediate semiconductor device in accordance with one embodiment of the present disclosure.
Figure 3:
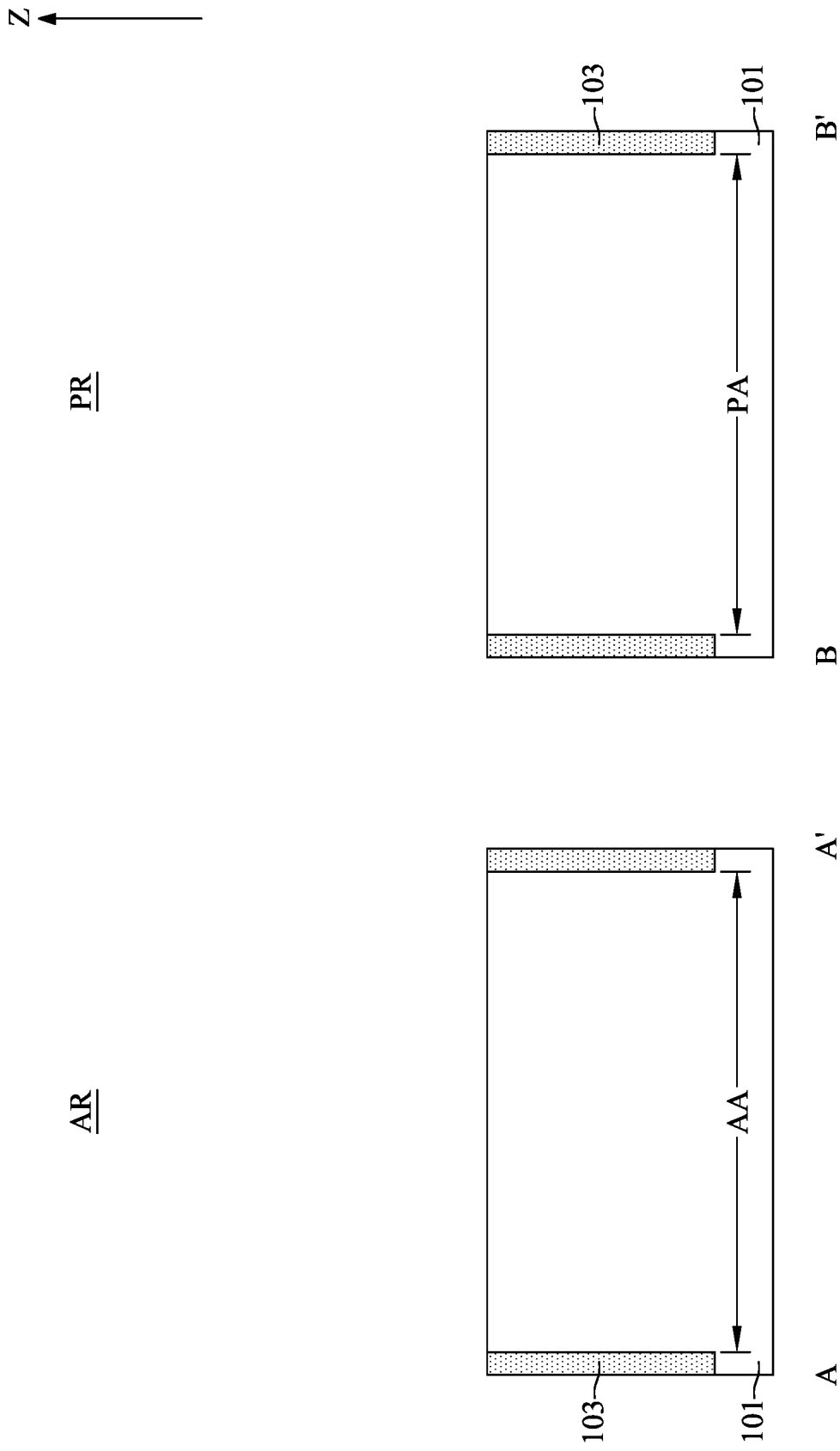
FIG. 3 is a schematic cross-sectional view diagram taken along lines A-A' and B-B' in FIG. 2.
Figure 4:
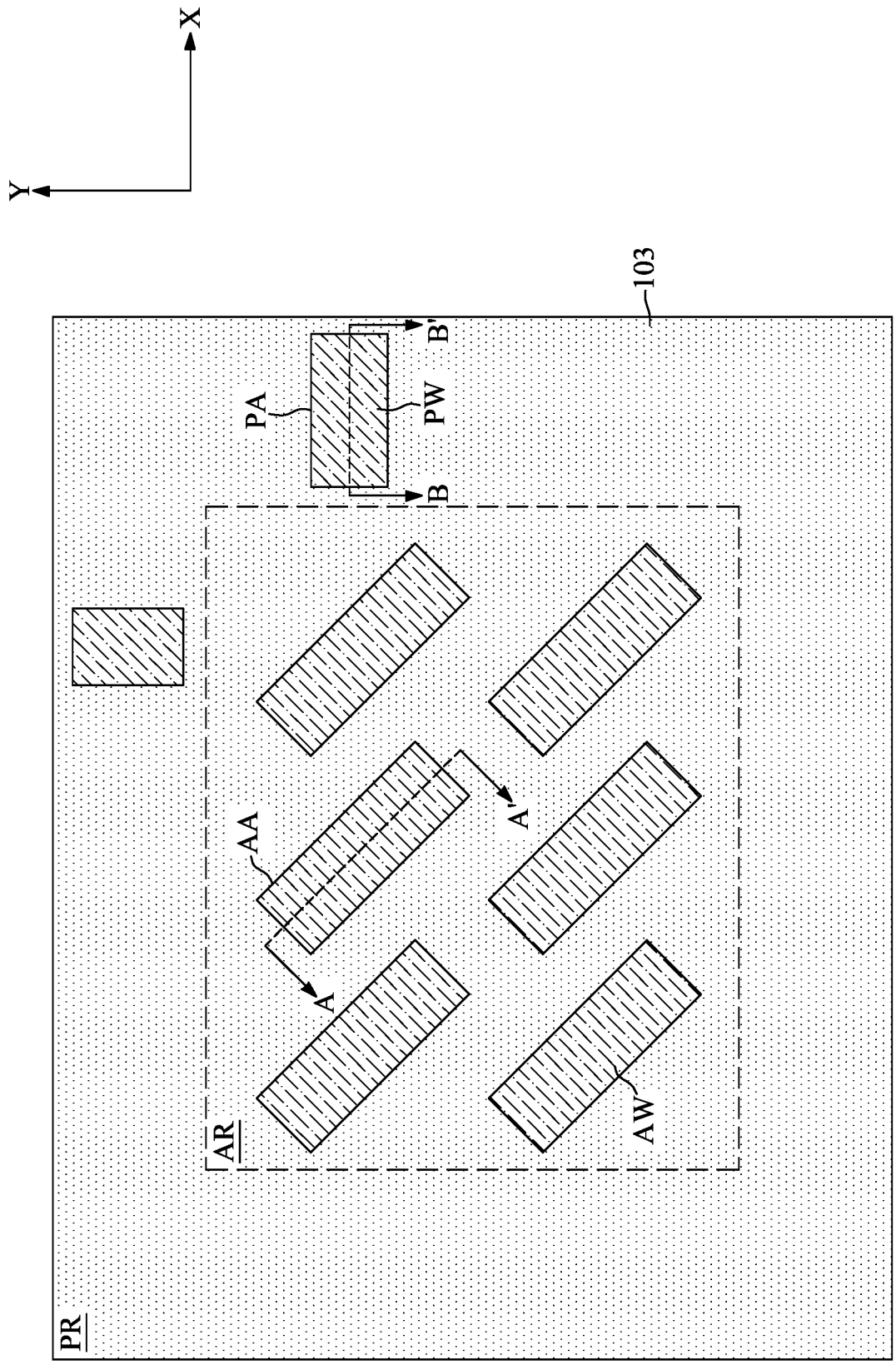
FIG. 4 illustrates, in a schematic top-view diagram, an intermediate semiconductor device in accordance with one embodiment of the present disclosure.
Figure 5:
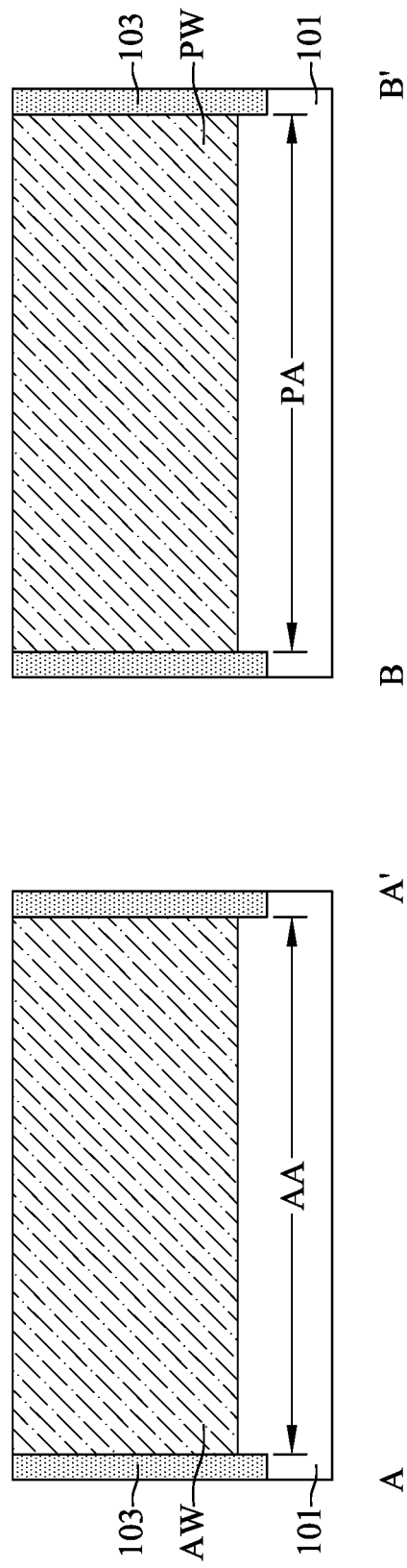
FIG. 5 is a schematic cross-sectional view diagram taken along lines A-A' and B-B' in FIG. 4.

FIG. 1 illustrates, in a flowchart diagram form, a method 10 for fabricating a semiconductor device 1 in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' in FIG. 2. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4.

With reference to FIGS. 1 to 5, at step S11, a substrate 101 may be provided, an isolation layer 103 may be formed in the substrate 101 to define a plurality of array active areas AA and a plurality of peripheral active areas PA, a plurality of array well regions AW may be formed in the plurality of array active areas AA, and a plurality of peripheral well regions PW may be formed in the plurality of peripheral active areas PA.

With reference to FIGS. 2 and 3, the substrate 101 may include an array region AR and a peripheral region PR. The peripheral region PR may surround the array region AR in a top-view perspective.

In some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

It should be noted that the array region AR may comprise a portion of the substrate 101 and a space above the portion of the substrate 101. Describing an element as being disposed on the array region AR means that the element is disposed on a top surface of the portion of the substrate 101. Describing an element as being disposed in the array region AR means that the element is disposed in the portion of the substrate 101; however, a top surface of the element may be even with the top surface of the portion of the substrate 101. Describing an element as being disposed above the array region AR means that the element is disposed above the top surface of the portion of the substrate 101. Accordingly, the peripheral region PR may comprise another portion of the substrate 101 and a space above the other portion of the substrate 101.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, a series of deposition processes may be performed to deposit a pad oxide layer (not shown for clarity) and a pad nitride layer (not shown for clarity) on the substrate 101. A photolithography process may be performed to define the position of the isolation layer 103. After the photolithography process, an etch process, such as an anisotropic dry etch process, may be performed to form trenches penetrating through the pad oxide layer, the pad nitride layer, and the substrate 101. An insulating material such as silicon oxide, silicon nitride, silicon oxynitride, or silicon nitride oxide may be deposited into the trenches and a planarization process, such as chemical mechanical polishing, may be subsequently performed to remove excess filling material until a top surface of the substrate 101 is exposed so as to form the isolation layer 103. The top surface of the isolation layer 103 and the top surface of the substrate 101 may be substantially coplanar. The isolation layer 103 may define the plurality of array active areas AA in the array region AR and the plurality of peripheral active areas PA in the peripheral region PR. In some embodiments, the plurality of array active areas AA may extend along a direction slant with respect to the direction X and the direction Y. In some embodiments, some of the plurality of peripheral active areas PA may extend along the direction parallel to the direction X. In some embodiments, some of the plurality of peripheral active areas PA may extend along the direction parallel to the direction Y.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

For brevity, clarity, and convenience of description, only elements in one array active area AA is described. All other array active areas AA may have the same elements and may have the same configuration. Accordingly, only one peripheral active area PA is described for brevity, clarity, and convenience of description.

With reference to FIGS. 4 and 5, an array well region AW may be formed in the array active area AA and a peripheral well region PW may be formed in the peripheral active area PA. The array well region AW and the peripheral well region PW may be formed by an implantation process using, for example, p-type dopants. The array well region AW and the peripheral well region PW may have a first electrical type (e.g., the p-type). The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium and/or indium.

Figure 6:
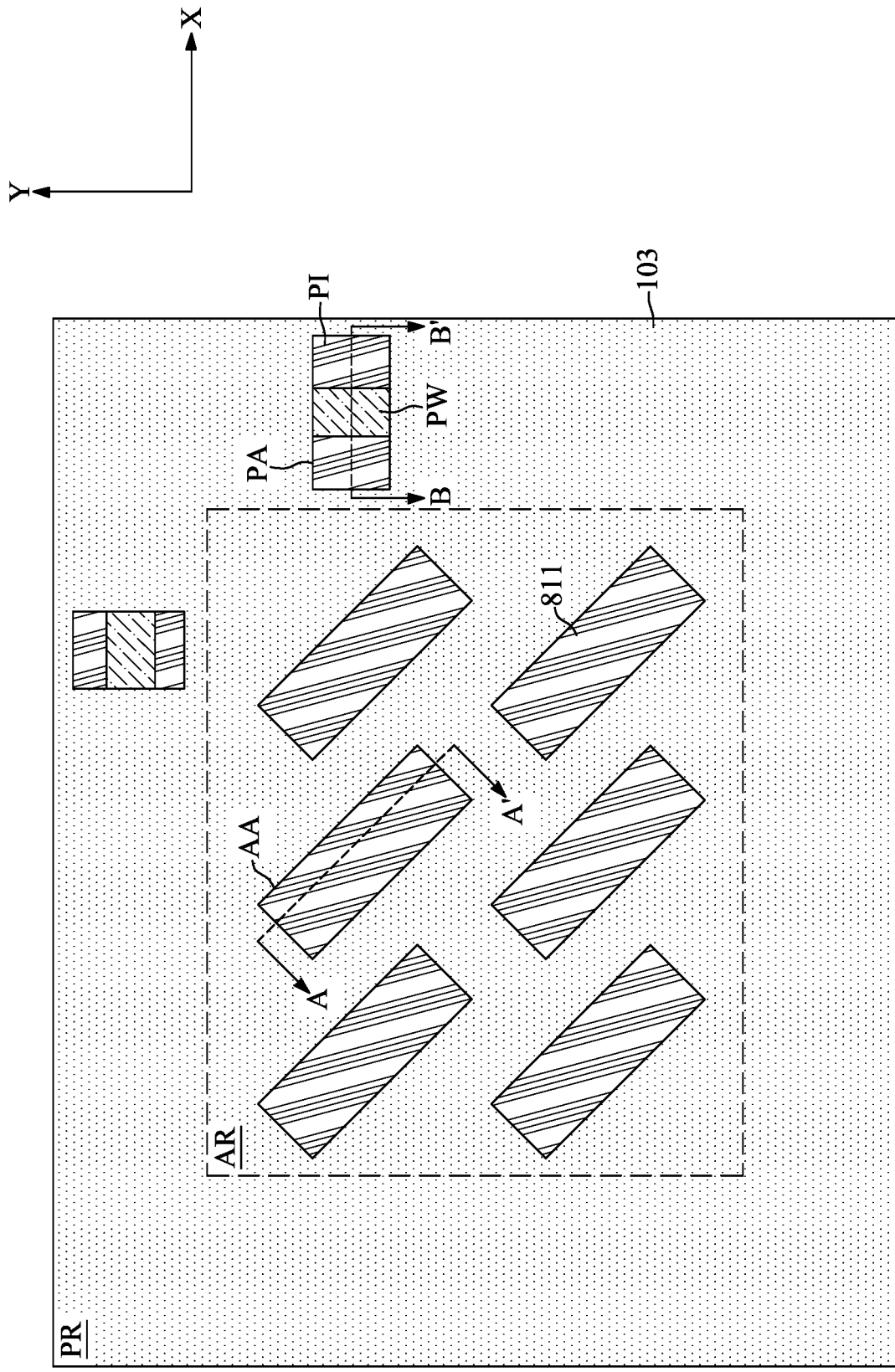
FIG. 6 illustrates, in a schematic top-view diagram, an intermediate semiconductor device in accordance with one embodiment of the present disclosure.
Figure 7:
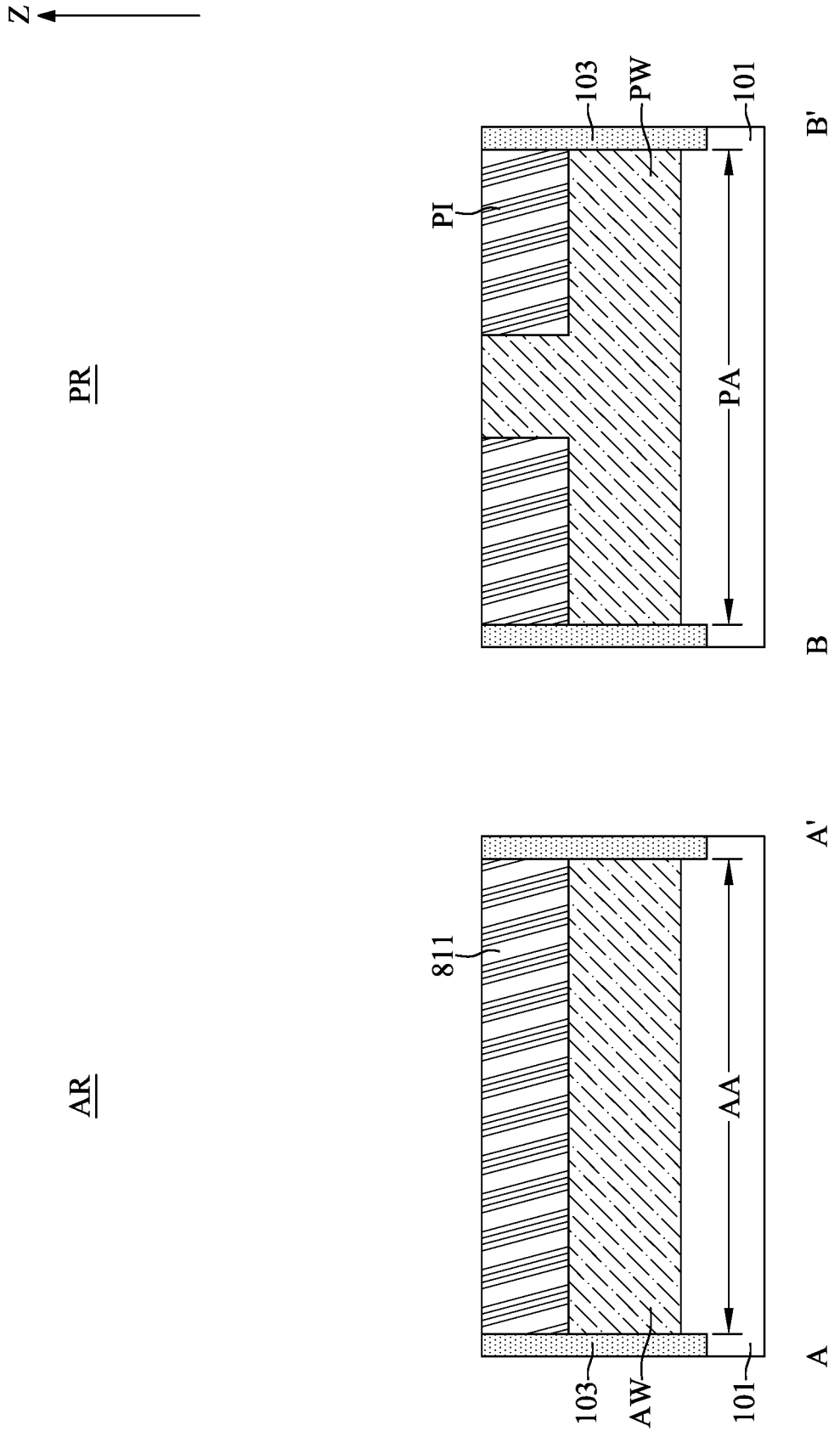
FIG. 7 is a schematic cross-sectional view diagram taken along lines A-A' and B-B' in FIG. 6.
Figure 8:
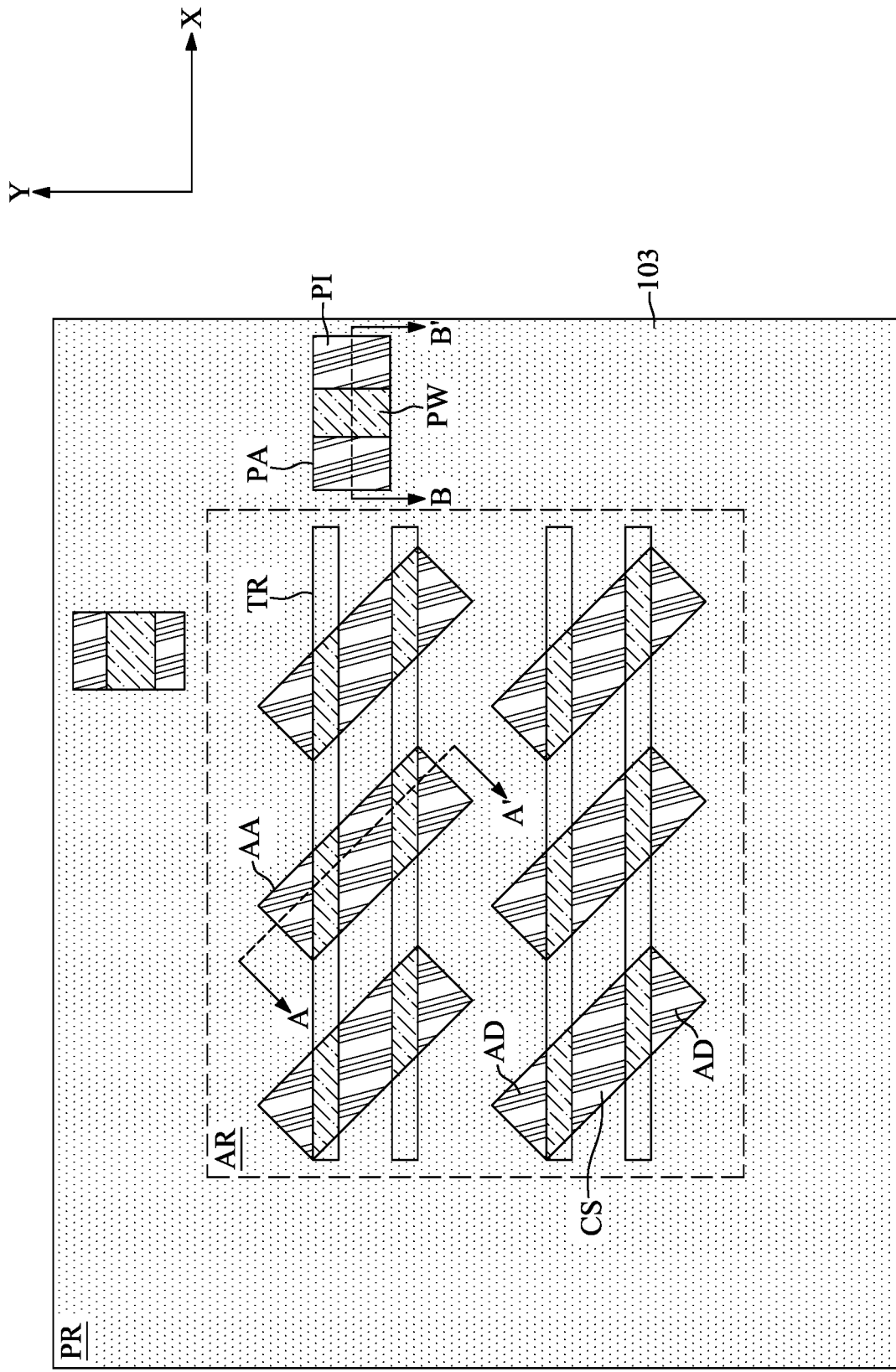
FIG. 8 illustrates, in a schematic top-view diagram, an intermediate semiconductor device in accordance with one embodiment of the present disclosure.
Figure 9:
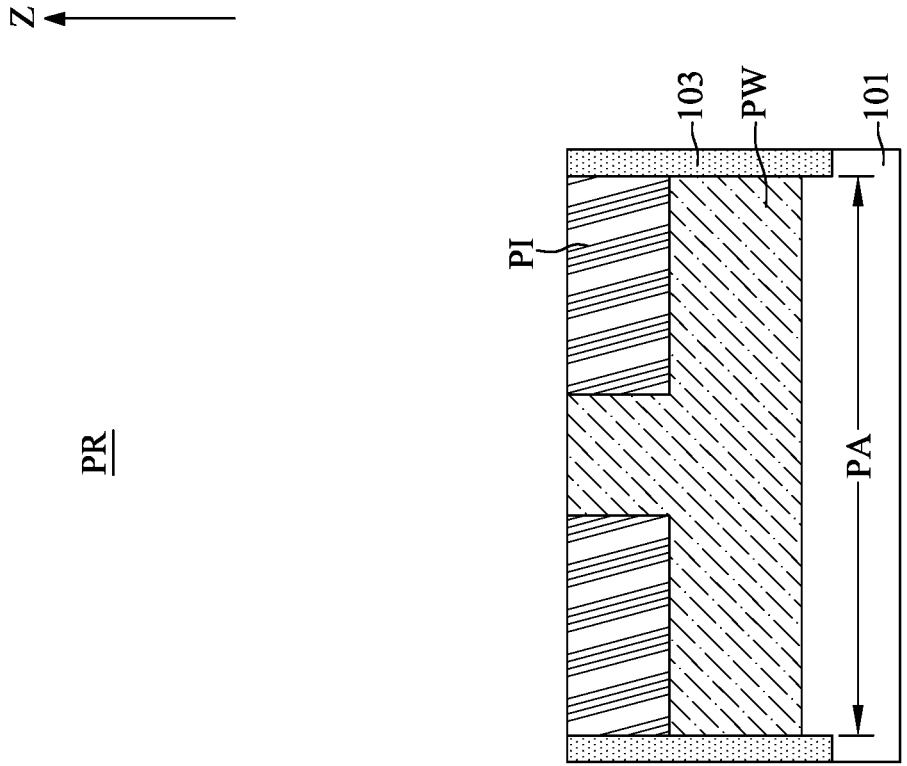
FIG. 9 is a schematic cross-sectional view diagram taken along lines A-A' and B-B' in FIG. 8.
Figure 9:
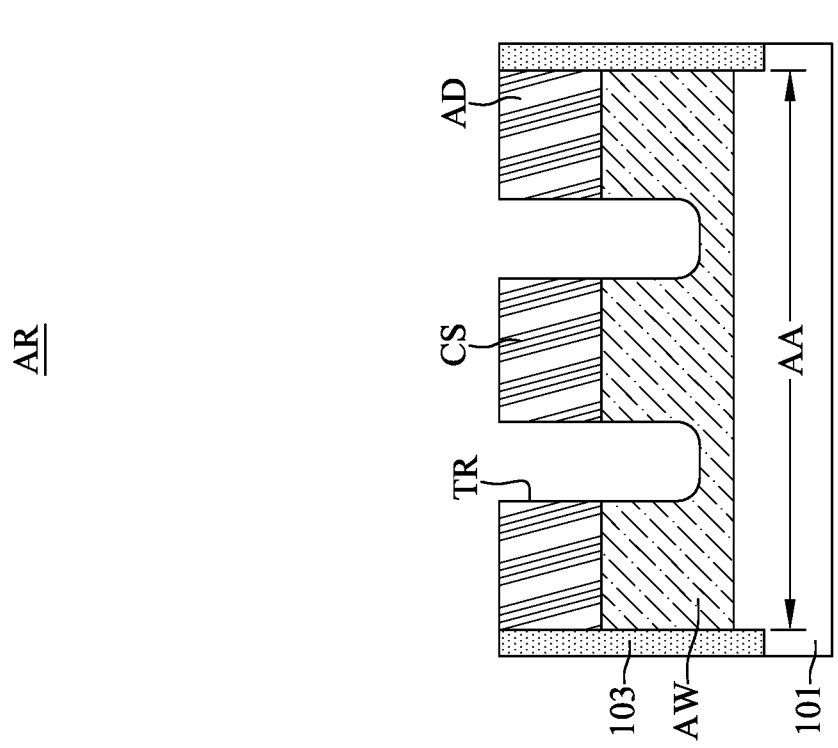
Figure 10:
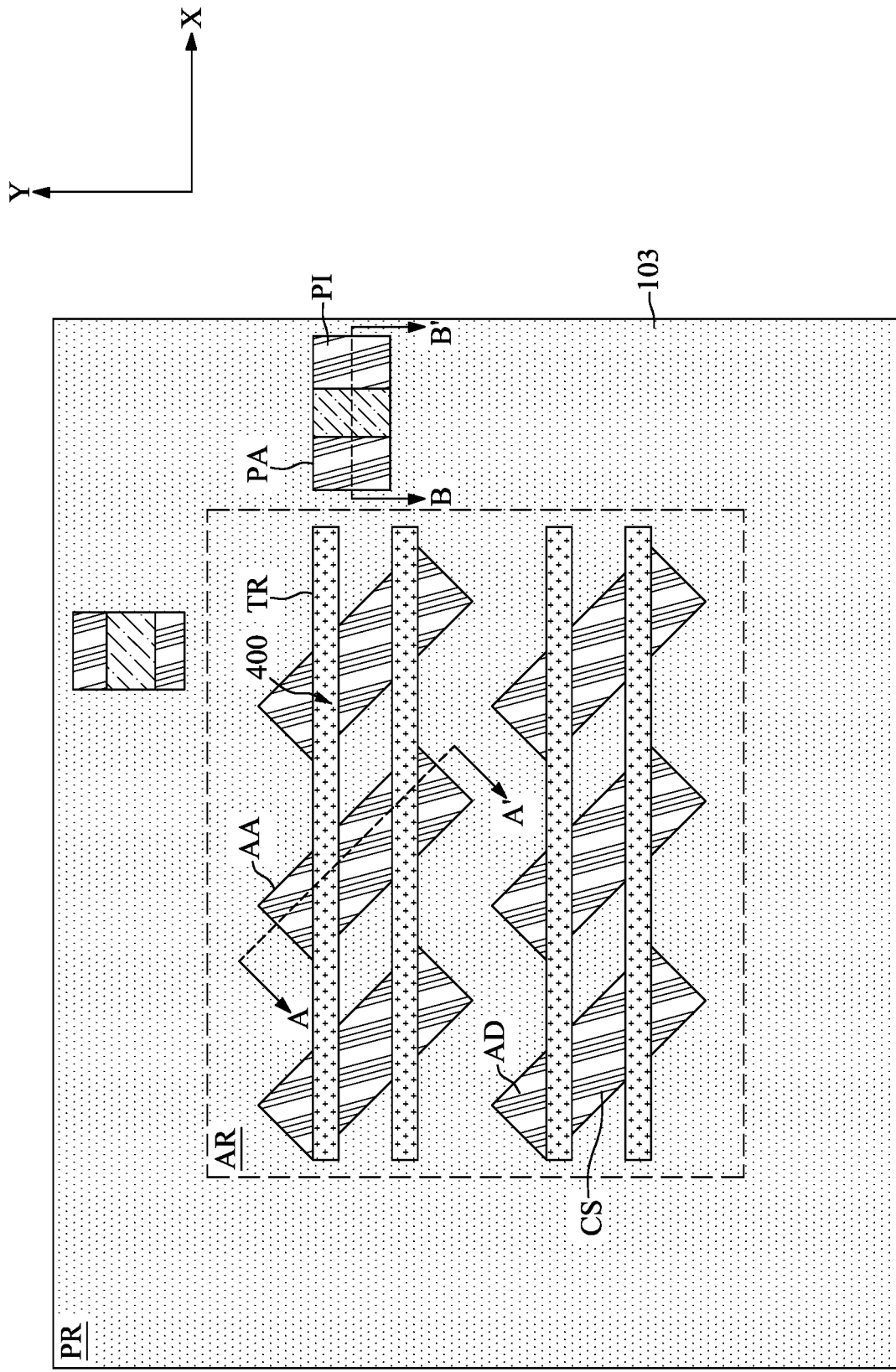
FIG. 10 illustrates, in a schematic top-view diagram, an intermediate semiconductor device in accordance with one embodiment of the present disclosure.

FIG. 6 illustrates, in a schematic top-view diagram, an intermediate semiconductor device in accordance with one embodiment of the present disclosure. FIG. 7 is a schematic cross-sectional view diagram taken along lines A-A' and B-B' in FIG. 6. FIG. 8 illustrates, in a schematic top-view diagram, an intermediate semiconductor device in accordance with one embodiment of the present disclosure. FIG. 9 is a schematic cross-sectional view diagram taken along lines A-A' and B-B' in FIG. 8. FIG. 10 illustrates, in a schematic top-view diagram, an intermediate semiconductor device in accordance with one embodiment of the present disclosure. FIGS. 11 to 14 are schematic cross-sectional view diagrams taken along line A-A' and B-B' in FIG. 10 illustrating part of a flow for fabricating the semiconductor device 1 in accordance with one embodiment of the present disclosure.

With reference to FIG. 1 and FIGS. 6 to 11, at step S13, a plurality of peripheral source/drain regions PI may be formed in the plurality of peripheral active areas PA, a plurality of word line structures 400 may be formed in the plurality of array well regions AW, and a plurality of common source regions CS and a plurality of array drain regions AD may be formed in the plurality of array active areas AA.

With reference to FIGS. 6 and 7, the plurality of peripheral source/drain regions PI may be formed in the plurality of peripheral active areas PA, respectively and correspondingly. The plurality of peripheral source/drain regions PI may be formed by an implantation process with a mask layer (not shown) covering the middle portion of the peripheral active area PA. The implantation process may employ, for example, n-type dopants. The n-type dopants may be added to an intrinsic semiconductor to contribute free electrons to the intrinsic semiconductor. In a silicon-containing substrate, examples of n-type dopants, i.e., impurities, include but are not limited to antimony, arsenic, and phosphorous. The plurality of peripheral source/drain regions PI may have a second electrical type (e.g., the n-type) opposite to the first electrical type. In some embodiments, the dopant concentration of the plurality of peripheral source/drain regions PI may be between about 1E19 atoms/cm^3 and about 1E21 atoms/cm^3; although other dopant concentrations that are lesser than, or greater than, the aforementioned range may also be employed in the present application.

With reference to FIGS. 6 and 7, the plurality of impurity regions 811 may be concurrently formed in the plurality of array active areas AA during the formation of the plurality of peripheral source/drain regions PI. The plurality of impurity regions 811 may have the second electrical type. In some embodiments, the dopant concentration of the plurality of impurity regions 811 may be between about 1E19 atoms/cm^3 and about 1E21 atoms/cm^3; although other dopant concentrations that are lesser than, or greater than, the aforementioned range may also be employed in the present application.

In some embodiments, an annealing process may be performed to activate the plurality of peripheral source/drain regions PI and the plurality of impurity regions 811. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

With reference to FIGS. 8 and 9, a plurality of word line trenches TR may be formed in the array region AR to define the position of the plurality of word line structures 400. The plurality of word line trenches TR may be formed by a photolithography process and a following etch process. In some embodiments, the plurality of word line trenches TR may have a line shape and extend along the direction X and traversing the plurality of array active areas AA in a top-view perspective. For example, each array active area AA may be intersected with two word line trenches TR. Each of the plurality of impurity regions 811 may be divided into the two array drain regions AD and one common source region CS by the two word line trenches TR. The two array drain regions AD may be respectively formed between the two word line trenches TR and the isolation layer 103. The common source region CS may be formed between the two word line trenches TR. The electric type and the dopant concentration of the plurality of array drain regions AD and the plurality of common source regions CS are the same as the electric type and the dopant concentration of the plurality of impurity regions 811.

Figure 11:
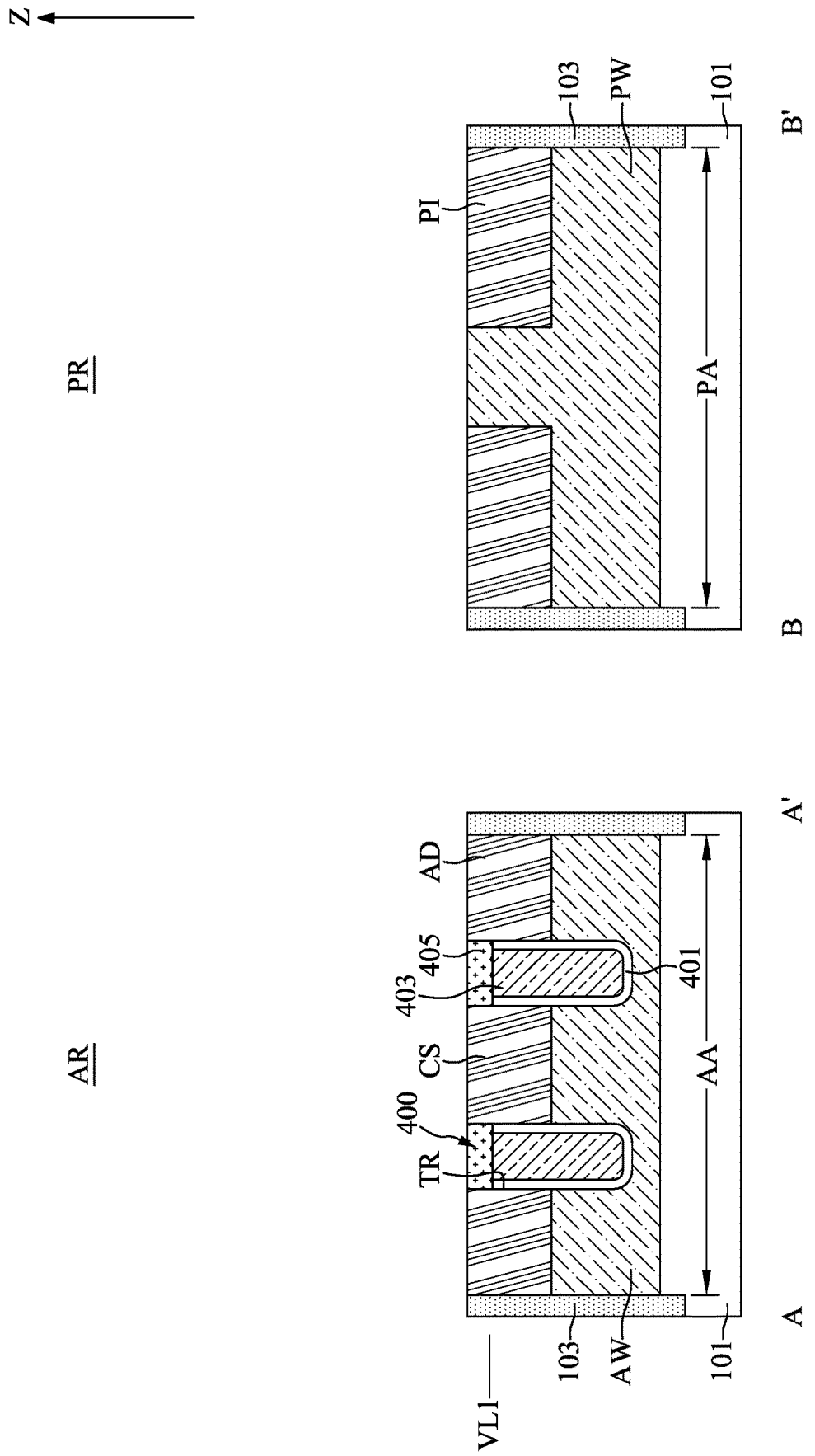
FIGS. 11 to 14 are schematic cross-sectional view diagrams taken along line A-A' and B-B' in FIG. 10 illustrating part of a flow for fabricating the semiconductor device in accordance with one embodiment of the present disclosure.

With reference to FIGS. 10 and 11, the plurality of word line structures 400 (e.g., two word line structures 400) may be formed in the two word line trenches TR, respectively and correspondingly. For brevity, clarity, and convenience of description, only one word line structure 400 is described. The word line structure 400 may include a word line dielectric layer 401, a word line conductive layer 403, and a word line capping layer 405.

With reference to FIGS. 10 and 11, the word line dielectric layer 401 may be conformally formed on the surface of the word line trench TR. The word line dielectric layer 401 may have a U-shaped cross-sectional profile. In other words, the word line dielectric layer 401 may be inwardly formed in the array active area AA. In some embodiments, the word line dielectric layer 401 may be formed by a thermal oxidation process. For example, the word line dielectric layer 401 may be formed by oxidizing the surface of the word line trench TR. In some embodiments, the word line dielectric layer 401 may be formed by a deposition process such as a chemical vapor deposition or an atomic layer deposition. The word line dielectric layer 401 may include a high-k material, an oxide, a nitride, an oxynitride or combinations thereof. In some embodiments, after a liner polysilicon layer (not shown for clarity) is deposited, the word line dielectric layer 401 may be formed by radical-oxidizing the liner polysilicon layer. In some embodiments, after a liner silicon nitride layer (not shown for clarity) is formed, the word line dielectric layer 401 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIGS. 10 and 11, the word line conductive layer 403 may be formed on the word line dielectric layer 401. In some embodiments, in order to form the word line conductive layer 403, a conductive layer (not shown for clarity) may be formed to fill the word line trench TR, and a recessing process may be subsequently performed. The recessing process may be performed as an etch-back process or sequentially performed as the planarization process and an etch-back process. The word line conductive layer 403 may have a recessed shape that partially fills the word line trench TR. That is, the top surface of the word line conductive layer 403 may be at a vertical level VL1 lower than the top surface of the substrate 101.

In some embodiments, the word line conductive layer 403 may include a metal, a metal nitride, or a combination thereof. For example, the word line conductive layer 403 may be formed of titanium nitride, tungsten, or a titanium nitride/tungsten. After the titanium nitride is conformally formed, the titanium nitride/tungsten may have a structure where the word line trench TR is partially filled using tungsten. The titanium nitride or the tungsten may be solely used for the word line conductive layer 403. In some embodiments, the word line conductive layer 403 may be formed of, for example, a conductive material such as polycrystalline silicon, polycrystalline silicon germanium, or a combination thereof. In some embodiments, the word line conductive layer 403 may be doped with a dopant such as phosphorus, arsenic, antimony, or boron. In some embodiments, the word line conductive layer 403 may be formed of, for example, tungsten, aluminum, titanium, copper, the like, or a combination thereof.

With reference to FIGS. 10 and 11, a dielectric material (not shown) may be deposited by, for example chemical vapor deposition, to completely fill the word line trenches TR and covering the top surface of the substrate 101. A planarization process, such as chemical mechanical polishing, may be performed to provide a substantially flat surface for subsequent processing steps and form the word line capping layer 405. In some embodiments, the word line capping layer 405 may be formed of, for example, silicon oxide, silicon nitride, or other applicable dielectric material.

Figure 15:
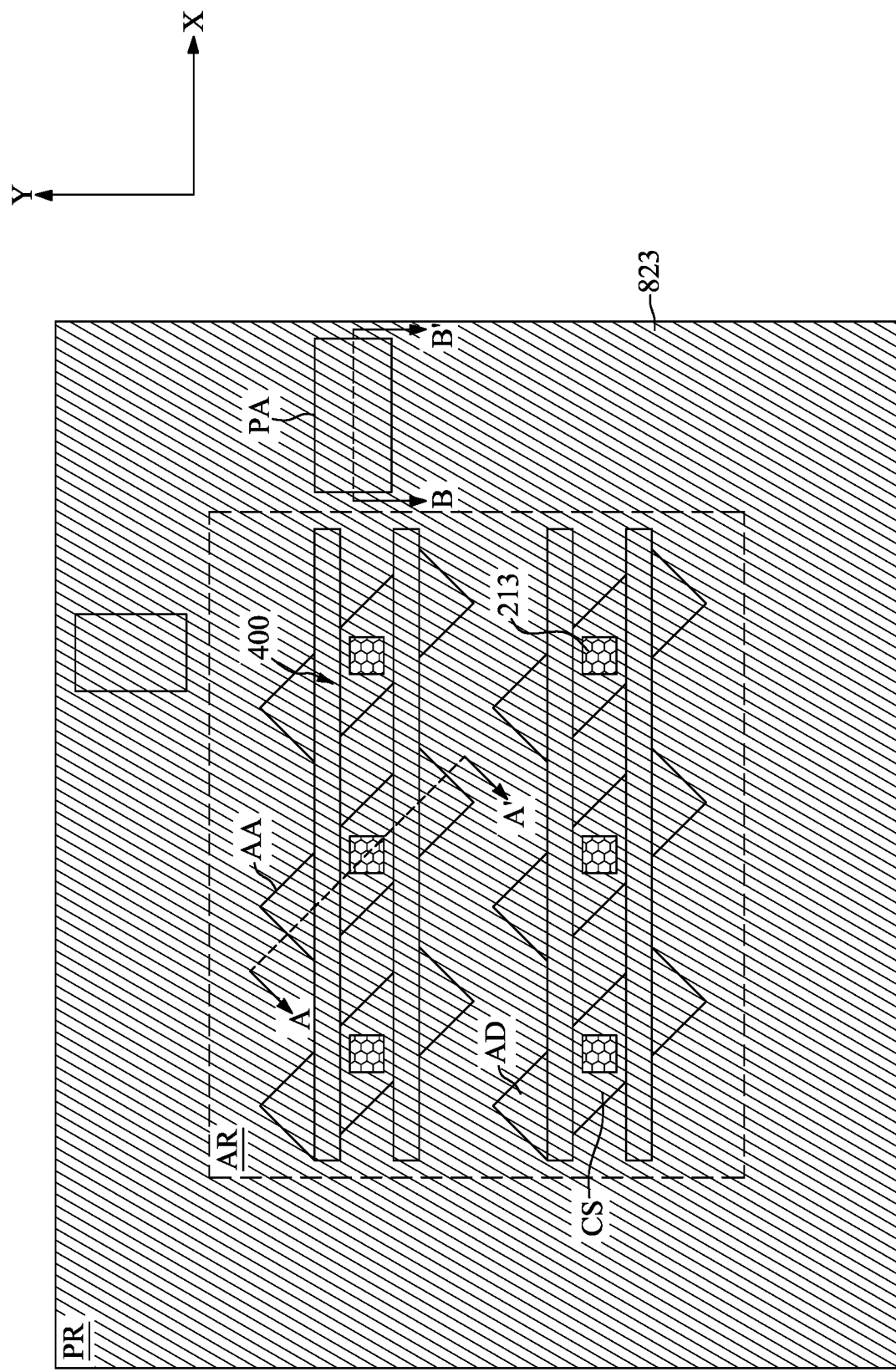
FIG. 15 illustrates, in a schematic top-view diagram, an intermediate semiconductor device in accordance with one embodiment of the present disclosure.

FIG. 15 illustrates, in a schematic top-view diagram, an intermediate semiconductor device in accordance with one embodiment of the present disclosure. FIGS. 16 to 21 are schematic cross-sectional view diagrams taken along line A-A' and B-B' in FIG. 15 illustrating part of a flow for fabricating the semiconductor device 1 in accordance with one embodiment of the present disclosure.

Figure 12:
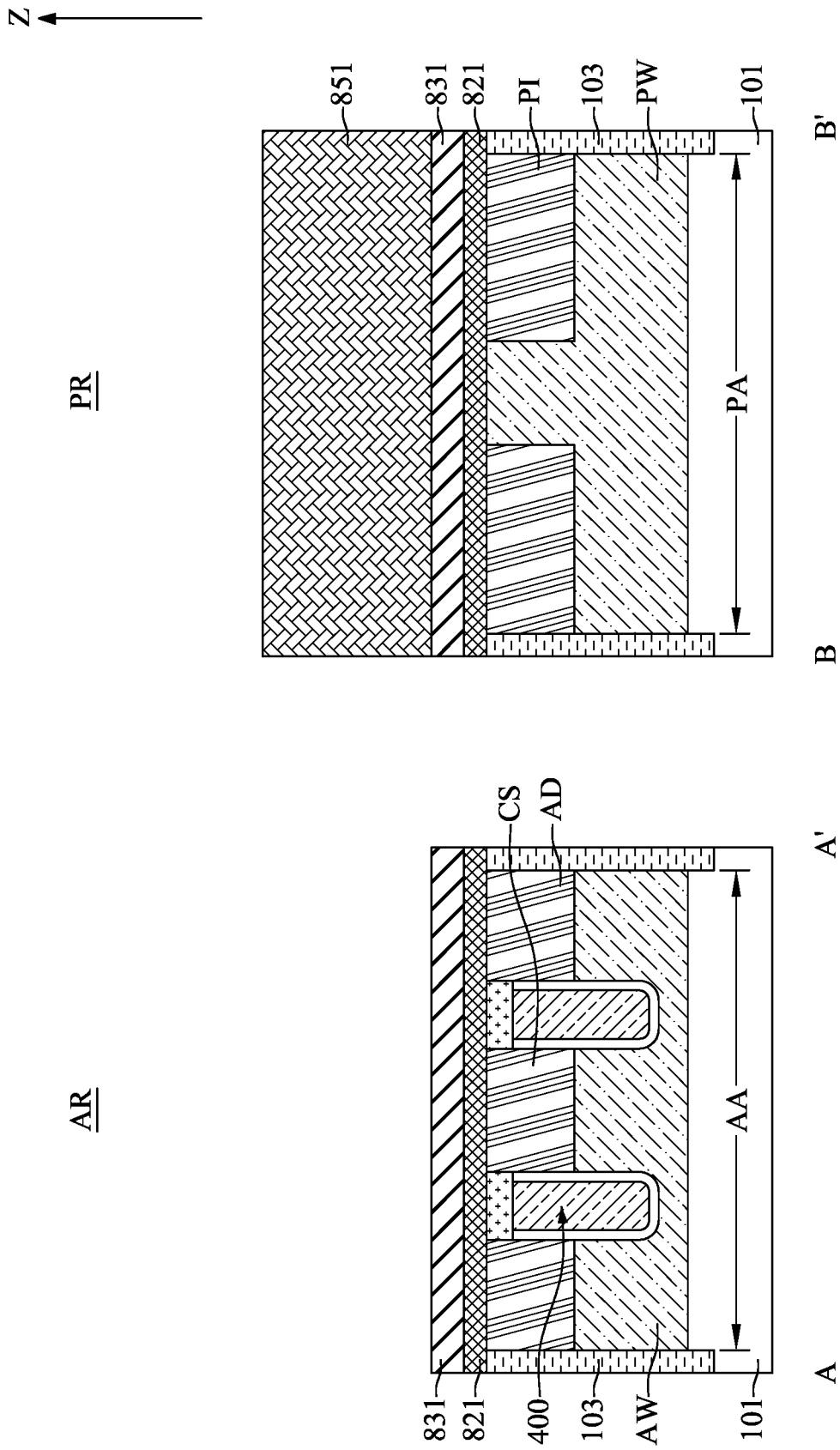
Figure 13:
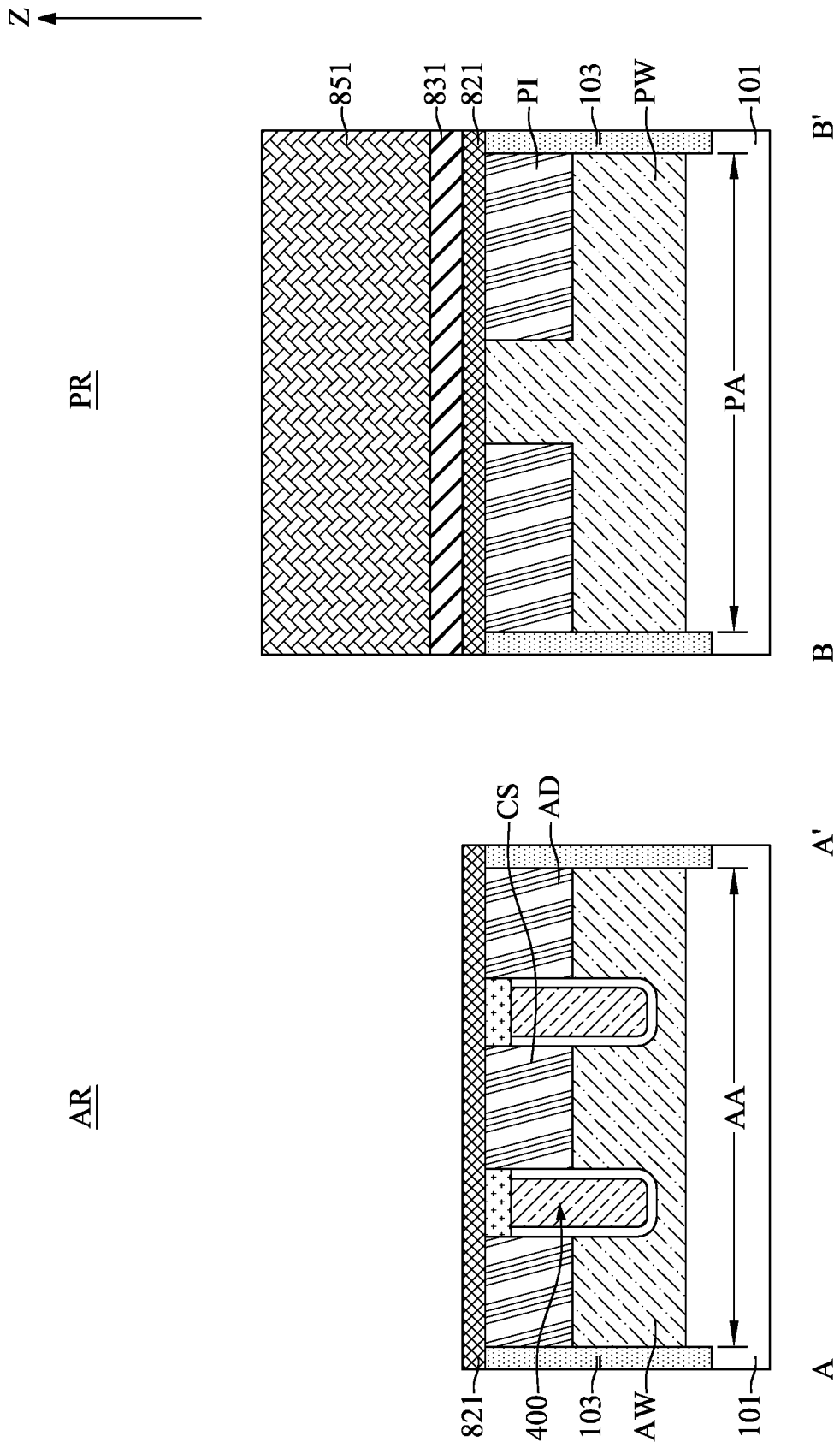

With reference to FIGS. 1, 12, and 13, at step S15, a layer of first insulating material 821 and a layer of first conductive material 831 may be formed on the substrate 101, and the layer of first conductive material 831 formed on the array region AR may be removed.

With reference to FIG. 12, the layer of first insulating material 821 may be formed on the array region AR and the peripheral region PR. In some embodiments, the first insulating material 821 may be, for example, silicon oxide or a high-k material. In some embodiments, the layer of first insulating material 821 may be formed by, for example, chemical vapor deposition, atomic layer deposition, or other applicable deposition process.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIG. 12, the layer of first conductive material 831 may be formed on the layer of first insulating material 821. The layer of first conductive material 831 may completely cover the array region AR and the peripheral region PR in a top-view perspective. In some embodiments, the first conductive material 831 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the dopants for the first conductive material 831 may include boron, aluminum, gallium, indium, antimony, arsenic, or phosphorus.

With reference to FIG. 12, a first mask layer 851 may be formed on the layer of first conductive material 831 and covering the peripheral region PR. In some embodiments, the first mask layer 851 may be a photoresist layer.

With reference to FIG. 13, a first etch process may be performed using the first mask layer 851 as a mask to remove the layer of first conductive material 831 formed on the array region AR. In some embodiments, the etch rate ratio of the first conductive material 831 to the first mask layer 851 may be between about 100:1 and about 1.05:1, between about 15:1 and about 2:1, or between about 10:1 and about 2:1 during the first etch process. In some embodiments, the etch rate ratio of the first conductive material 831 to the first insulating material 821 may be between about 100:1 and about 1.05:1, between about 15:1 and about 2:1, or between about 10:1 and about 2:1 during the first etch process.

With reference to FIG. 1 and FIGS. 14 to 18, at step S17, a layer of second insulating material 823 may be formed above the substrate 101, a plurality of bit line contacts 213 may be formed on the array region AR, the layer of second insulating material 823 formed on the peripheral region PR may be removed.

Figure 14:
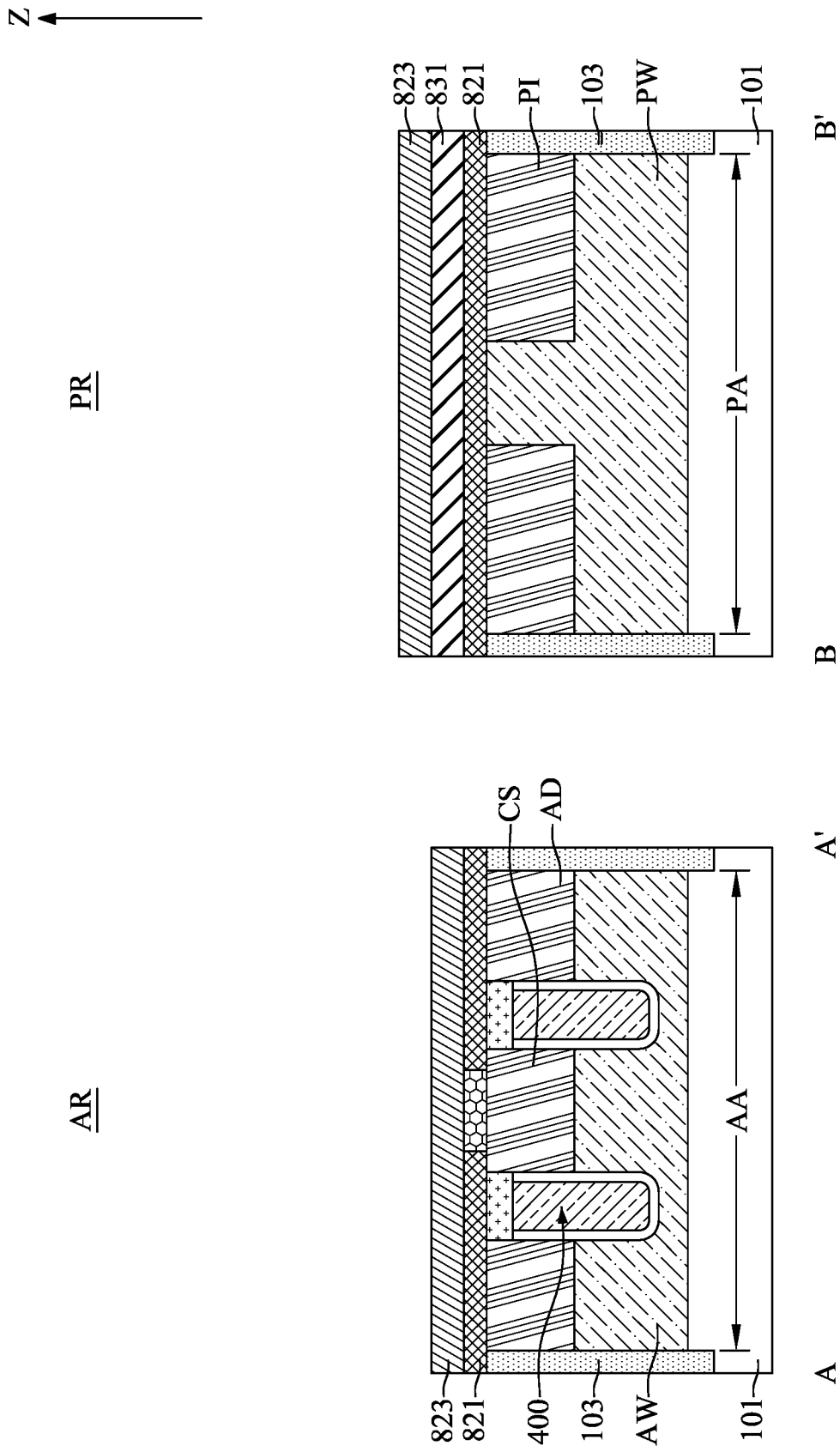

With reference to FIG. 14, the layer of second insulating material 823 may be formed on the layer of first insulating material 821 and the layer of first conductive material 831. In the current stage, the layer of second insulating material 823 may cover the array region AR and the peripheral region PR in a top-view perspective. In some embodiments, the second insulating material 823 may be, for example, silicon oxide, silicon nitride, silicon oxynitride, silicon nitride oxide, a high-k material, or a combination thereof.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

Figure 16:
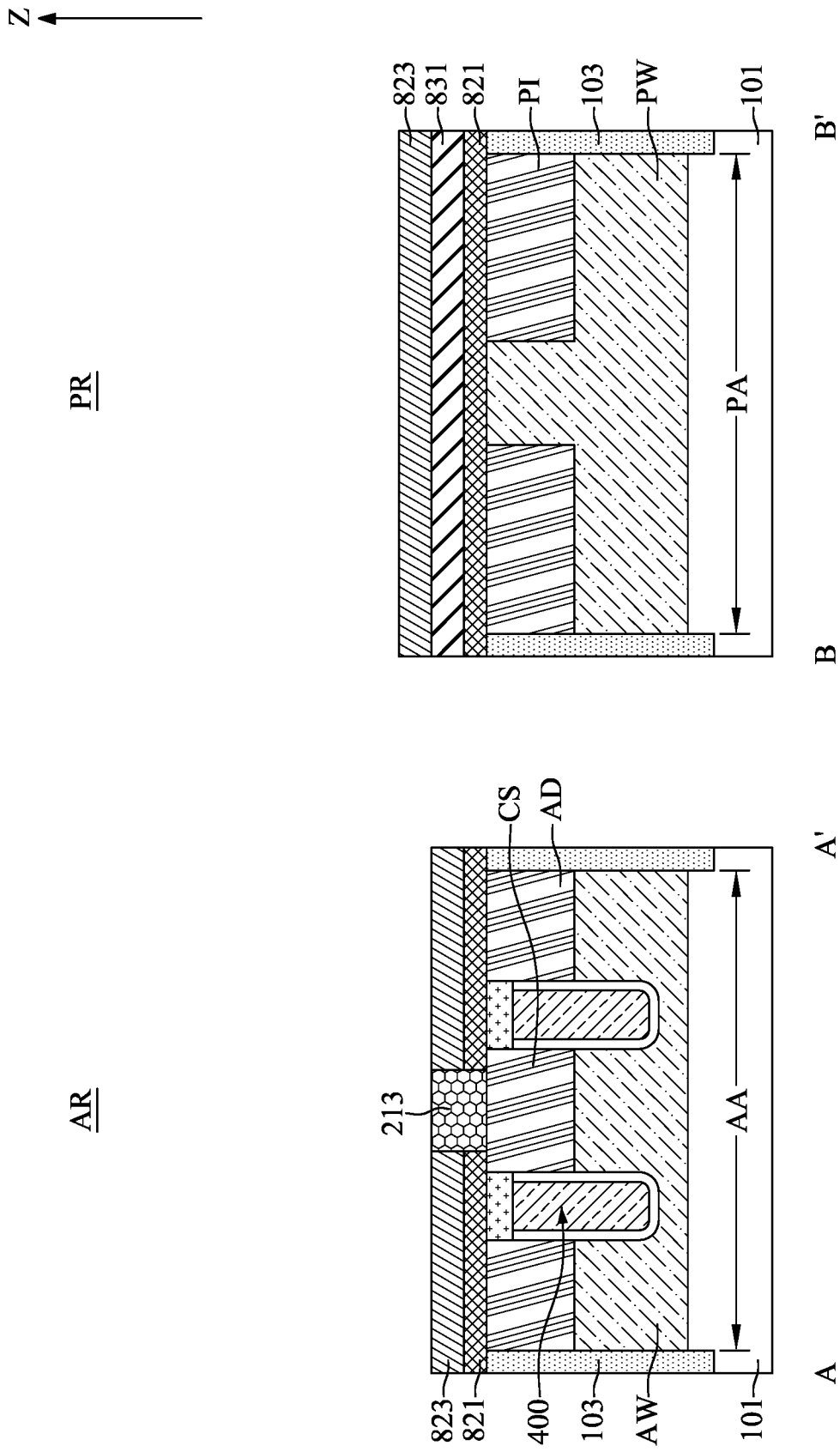
FIGS. 16 to 21 are schematic cross-sectional view diagrams taken along line A-A' and B-B' in FIG. 15 illustrating part of a flow for fabricating the semiconductor device in accordance with one embodiment of the present disclosure.

With reference to FIGS. 15 and 16, a plurality of bit line contacts 213 may be formed along the layer of second insulating material 823 and the layer of first insulating material 821 to contact the plurality of common source regions CS. In some embodiments, the plurality of bit line contacts 213 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 17:
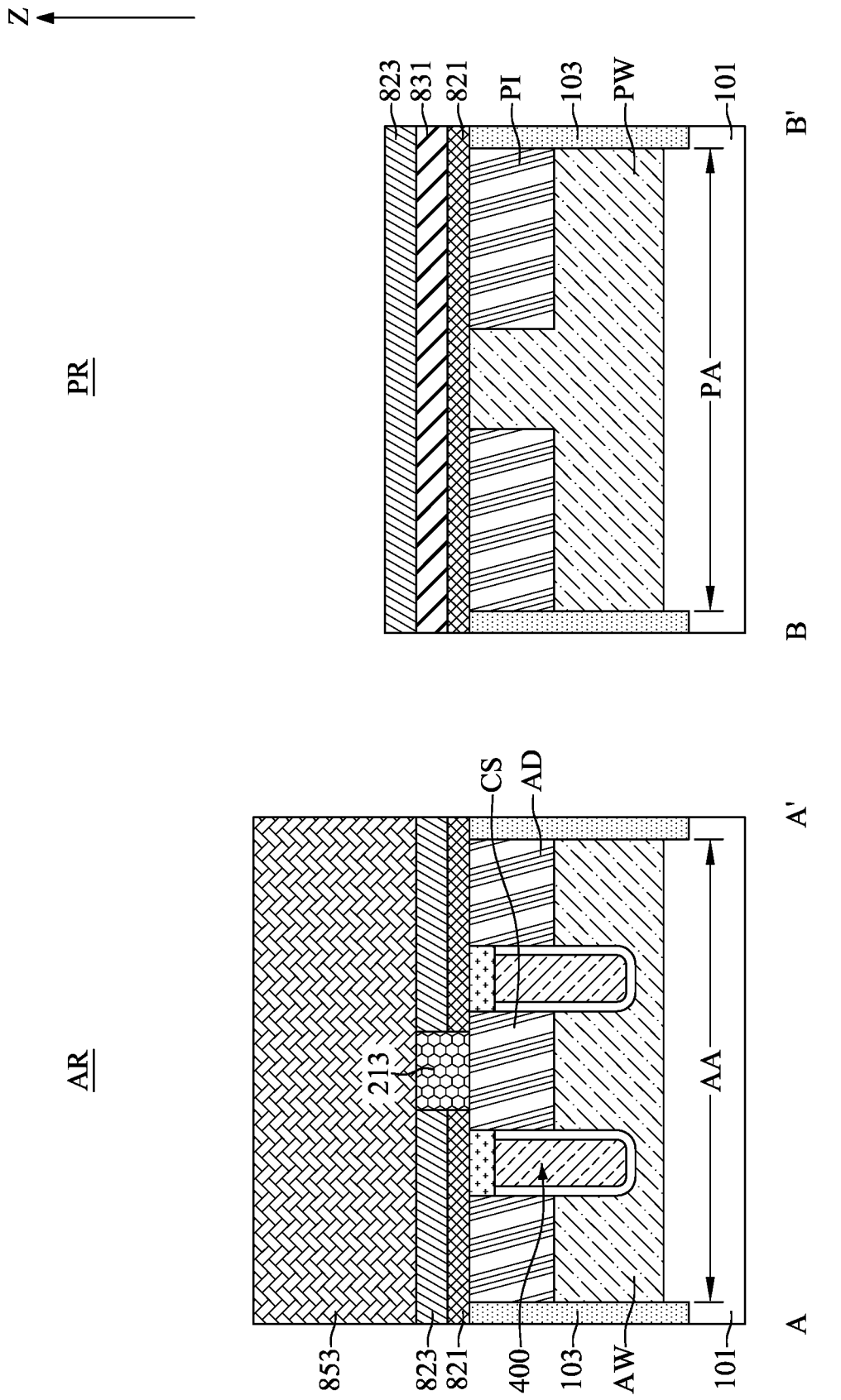

With reference to FIG. 17, a second mask layer 853 may be formed on the layer of second insulating material 823 and covering the array region AR. In some embodiments, the second mask layer 853 may be a photoresist layer.

Figure 18:
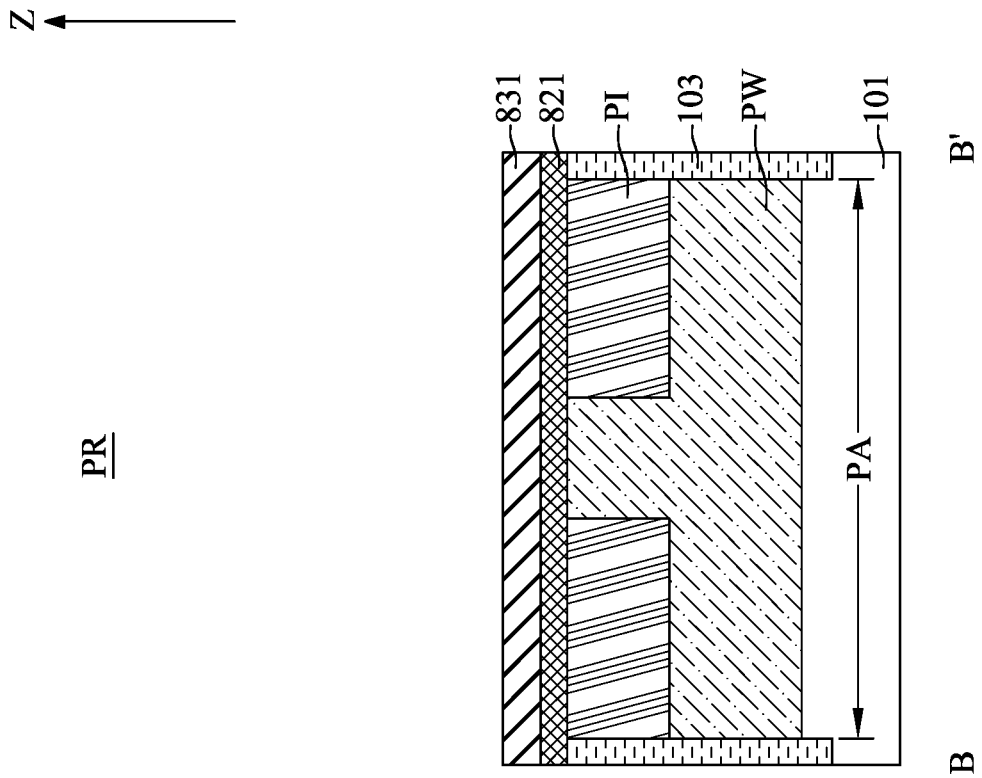
Figure 18:
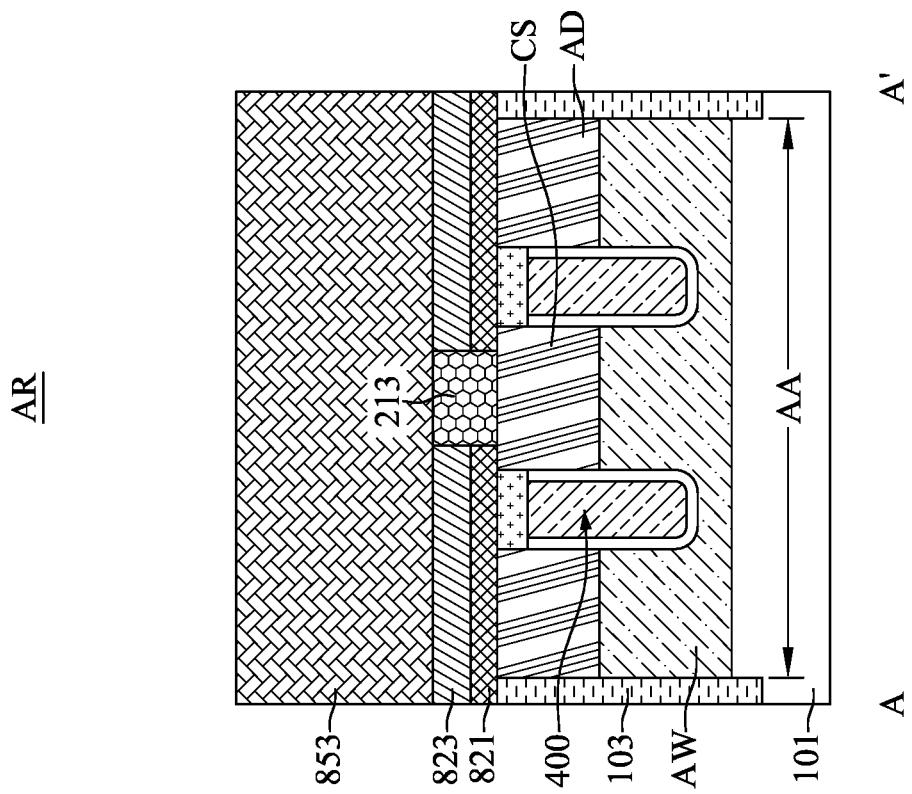

With reference to FIG. 18, a second etch process may be performed using the second mask layer 853 as a mask to remove the layer of second insulating material 823 formed on the peripheral region PR. In some embodiments, the etch rate ratio of the second insulating material 823 to the second mask layer 853 may be between about 100:1 and about 1.05:1, between about 15:1 and about 2:1, or between about and about 2:1 during the second etch process. In some embodiments, the etch rate ratio of the second insulating material 823 to the first conductive material 831 may be between about 100:1 and about 1.05:1, between about 15:1 and about 2:1, or between about 10:1 and about 2:1 during the second etch process.

With reference to FIG. 1 and FIGS. 19 to 21, at step S19, a layer of second conductive material 833 may be formed over the substrate 101, a layer of third conductive material 835 may be formed on the layer of second conductive material 833, and a layer of fourth conductive material 837 may be formed on the layer of third conductive material 835, a plurality of bit line capping layers 211 may be formed over the array region AR, and a plurality of peripheral gate capping layers 311 may be formed over the peripheral region PR.

Figure 19:
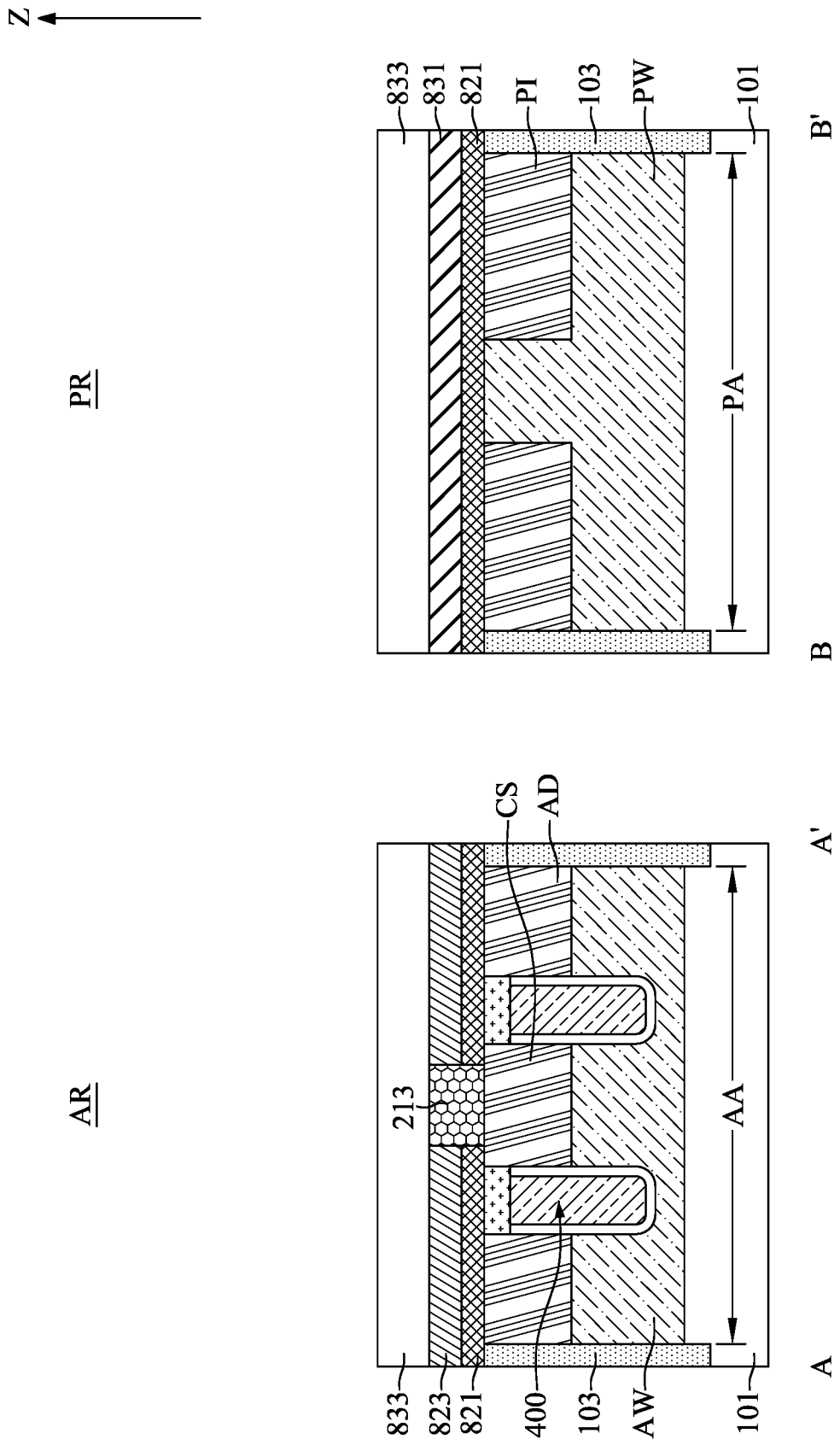

With reference to FIG. 19, the layer of second conductive material 833 may be formed on the layer of second insulating material 823 and on the layer of first conductive material 831. In the current stage, the layer of second conductive material 833 may cover the array region AR and the peripheral region PR in a top-view perspective. In some embodiments, the second conductive material 833 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the dopants for the second conductive material 833 may include boron, aluminum, gallium, indium, antimony, arsenic, or phosphorus.

Figure 20:
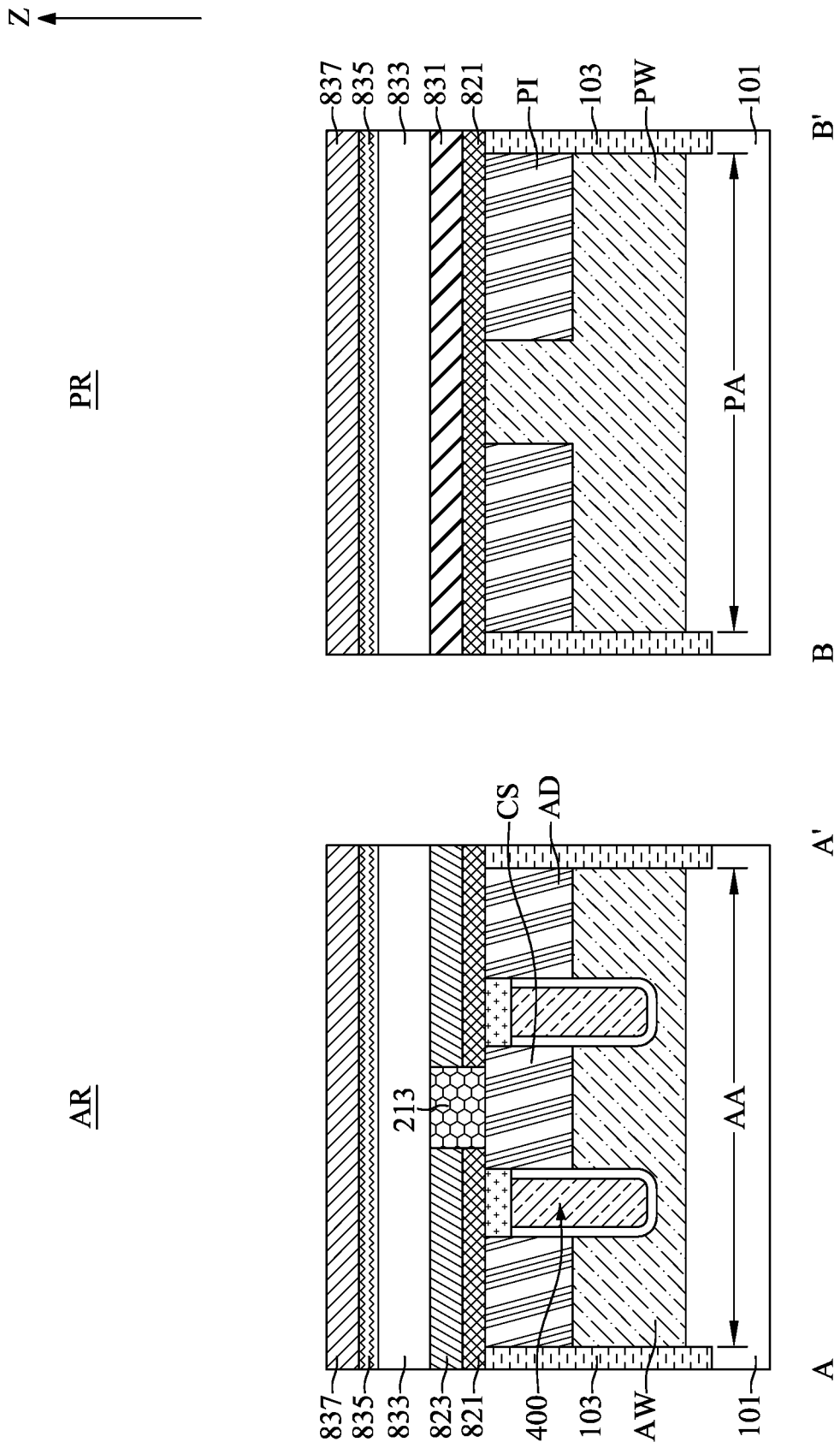

With reference to FIG. 20, the layer of third conductive material 835 may be formed on the layer of second conductive material 833 and may cover the array region AR and the peripheral region PR in a top-view perspective. In some embodiments, the third conductive material 835 may be, for example, titanium silicide, nickel silicide, nickel platinum silicide, tantalum silicide, or cobalt silicide. In some embodiments, the layer of third conductive material 835 may have a thickness between about 2 nm and about 20 nm.

With reference to FIG. 20, the layer of fourth conductive material 837 may be formed on the layer of third conductive material 835 and may cover the array region AR and the peripheral region PR in a top-view perspective. In some embodiments, the fourth conductive material 837 may be, for example, titanium, nickel, platinum, tantalum, cobalt, silver, copper, aluminum, other applicable conductive material, or a combination thereof.

For brevity, clarity, and convenience of description, only one bit line capping layer 211 and one peripheral gate capping layer 311 are described and shown.

Figure 21:
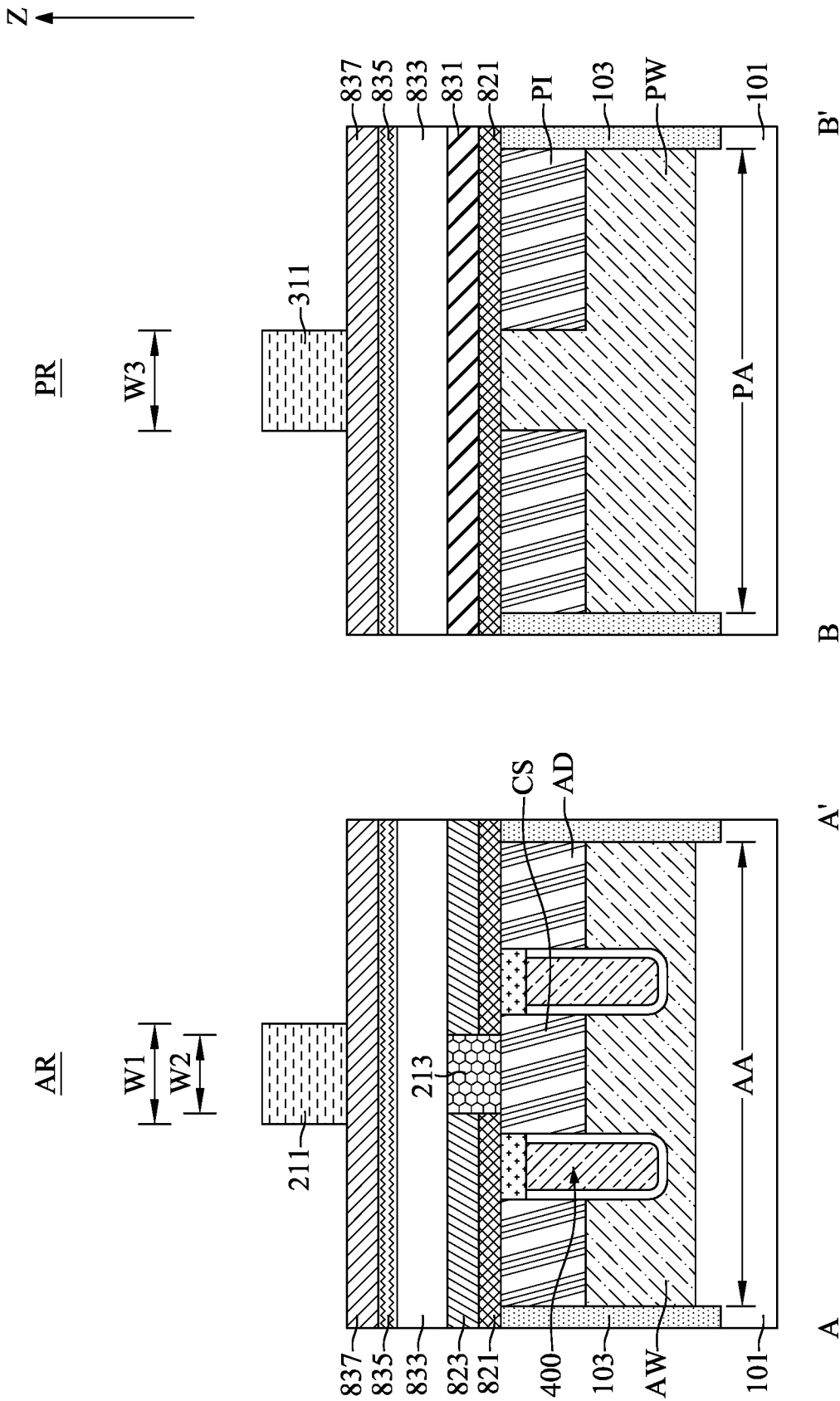

With reference to FIG. 21, the bit line capping layer 211 may be formed on the layer of fourth conductive material 837 and above the array region AR. The peripheral gate capping layer 311 may be formed on the layer of fourth conductive material 837 and above the peripheral region PR. The bit line capping layer 211 and the peripheral gate capping layer 311 may extend along a direction perpendicular to the plurality of word line structures 400 in a top-view perspective (not shown). In some embodiments, the bit line capping layer 211 and the peripheral gate capping layer 311 may be formed of, for example, silicon oxide, silicon nitride, silicon nitride oxide, silicon oxynitride, or other applicable insulating material. In some embodiments, the width W1 of the bit line capping layer 211 may be greater than the width W2 of the bit line contact 213. In some embodiments, the width W1 of the bit line capping layer 211 and the width W3 of the peripheral gate capping layer 311 may be substantially the same. In some embodiments, the width W1 of the bit line capping layer 211 and the width W3 of the peripheral gate capping layer 311 may be different. For example, the width W3 of the peripheral gate capping layer 311 may be greater than the width W1 of the bit line capping layer 211.

Figure 22:
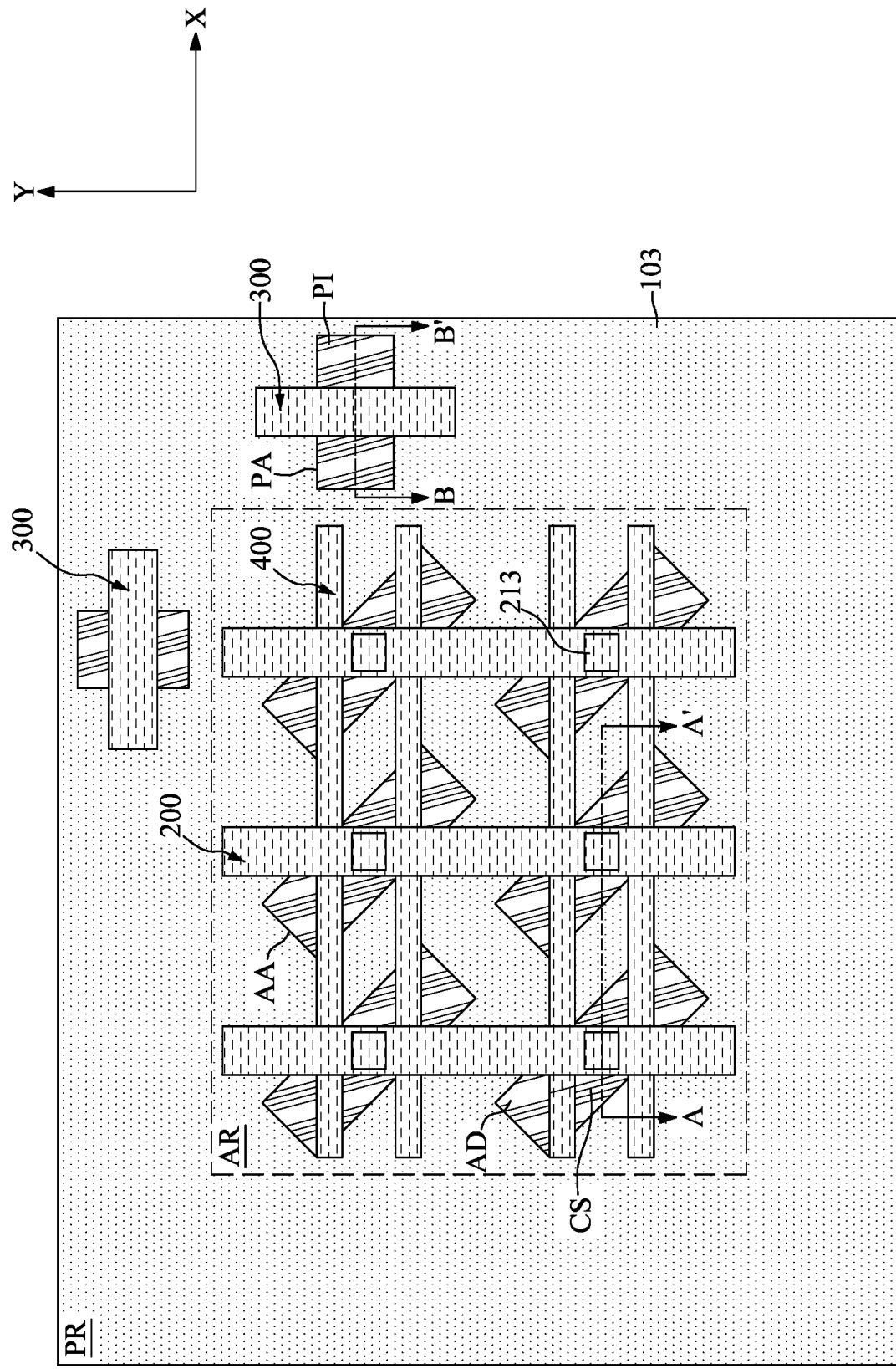
FIG. 22 illustrates, in a schematic top-view diagram, an intermediate semiconductor device in accordance with one embodiment of the present disclosure.

FIG. 22 illustrates, in a schematic top-view diagram, an intermediate semiconductor device in accordance with one embodiment of the present disclosure. FIGS. 23 to 29 are schematic cross-sectional view diagrams taken along line A-A' and B-B' in FIG. 22 illustrating part of the flow for fabricating the semiconductor device 1 in accordance with one embodiment of the present disclosure.

Figure 23:
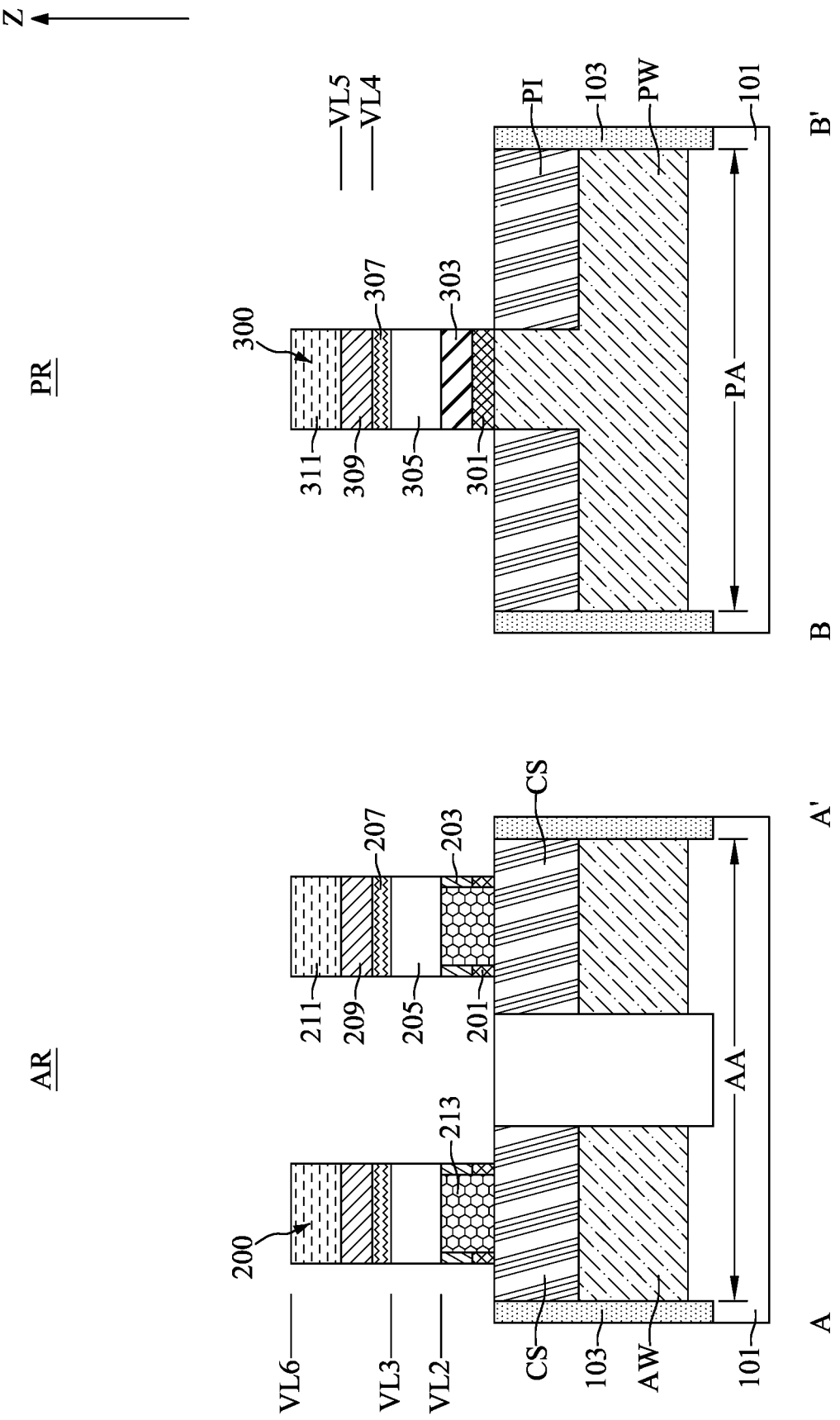
FIGS. 23 to 29 are schematic cross-sectional view diagrams taken along line A-A' and B-B' in FIG. 22 illustrating part of the flow for fabricating the semiconductor device in accordance with one embodiment of the present disclosure.

With reference to FIGS. 1, 22, and 23, at step S21, an etch process may be performed to form a plurality of bit line structures 200 above the array region AR and a plurality of peripheral gate structures 300 above the peripheral region PR.

For brevity, clarity, and convenience of description, only one bit line structure 200 and one peripheral gate structure 300 are described.

With reference to FIGS. 22 and 23, the etch process may be performed using the bit line capping layer 211 and the peripheral gate capping layer 311 as masks to remove portions of the layer of first insulating material 821, portions of the layer of second insulating material 823, portions of the layer of first conductive material 831, portions of the layer of second conductive material 833, portions of the layer of third conductive material 835, and portions of the layer of fourth conductive material 837.

After the etch process, the remaining first insulating material 821 may be turned into a bit line bottom insulating layer 201 on the array region AR and a peripheral gate bottom insulating layer 301 on the peripheral region PR. The remaining second insulating material 823 may be turned into a bit line dielectric layer 203 on the bit line bottom insulating layer 201. The remaining first conductive material 831 may be turned into a peripheral gate conductive layer 303 on the peripheral gate bottom insulating layer 301. The remaining second conductive material 833 may be turned into a bit line lower conductive layer 205 on the bit line dielectric layer 203 and a peripheral gate lower conductive layer 305 on the peripheral gate conductive layer 303. The remaining third conductive material 835 may be turned into a bit line middle conductive layer 207 on the bit line lower conductive layer 205 and a peripheral gate middle conductive layer 307 on the peripheral gate lower conductive layer 305. The remaining fourth conductive material 837 may be turned into a bit line higher conductive layer 209 on the bit line middle conductive layer 207 and a peripheral gate higher conductive layer 309 on the peripheral gate middle conductive layer 307.

With reference to FIGS. 22 and 23, the bit line bottom insulating layer 201, the bit line dielectric layer 203, the bit line lower conductive layer 205, the bit line middle conductive layer 207, the bit line higher conductive layer 209, and the bit line capping layer 211 together configure the bit line structure 200 on the array region AR. The bit line contact 213 may be disposed along the bit line dielectric layer 203 and the bit line bottom insulating layer 201 to electrically connect the bit line lower conductive layer 205 and the common source region CS. In a top-view perspective, the bit line structure 200 may extend along the direction perpendicular to the word line structure 400.

With reference to FIGS. 22 and 23, the peripheral gate bottom insulating layer 301, the peripheral gate conductive layer 303, the peripheral gate lower conductive layer 305, the peripheral gate middle conductive layer 307, the peripheral gate higher conductive layer 309, and the peripheral gate capping layer 311 together configure the peripheral gate structure 300 on the peripheral region PR. The plurality of peripheral source/drain regions PI may be disposed in the peripheral well region PW and adjacent to two sides of the peripheral gate bottom insulating layer 301. In some embodiments, the peripheral gate structure 300 may extend along the direction parallel to the bit line structure 200 in a top-view perspective. In some embodiments, the peripheral gate structure 300 may extend along the direction parallel to the word line structure 400.

With reference to FIGS. 22 and 23, in some embodiments, the top surface of the bit line dielectric layer 203 and the top surface of the peripheral gate conductive layer 303 may be at the same vertical level VL2. The top surface of the bit line lower conductive layer 205 and the top surface of the peripheral gate lower conductive layer 305 may be at the same vertical level VL3. The top surface of the bit line middle conductive layer 207 and the top surface of the peripheral gate middle conductive layer 307 may be at the same vertical level VL4. The top surface of the bit line higher conductive layer 209 and the top surface of the peripheral gate higher conductive layer 309 may be at the same vertical level VL5. The top surface of the bit line capping layer 211 and the top surface of the peripheral gate capping layer 311 may be at the same vertical level VL6.

With reference to FIG. 1 and FIGS. 24 to 26, at step S23, a first liner layer 501 may be conformally formed to cover the plurality of bit line structures 200 and the plurality of peripheral gate structures 300, a plurality of first bit line spacers 601 may be formed on sidewalls 200S of the plurality of bit line structures 200, and a plurality of first peripheral gate spacers 603 may be formed on sidewalls 300S of the plurality of peripheral gate structures 300.

Figure 24:
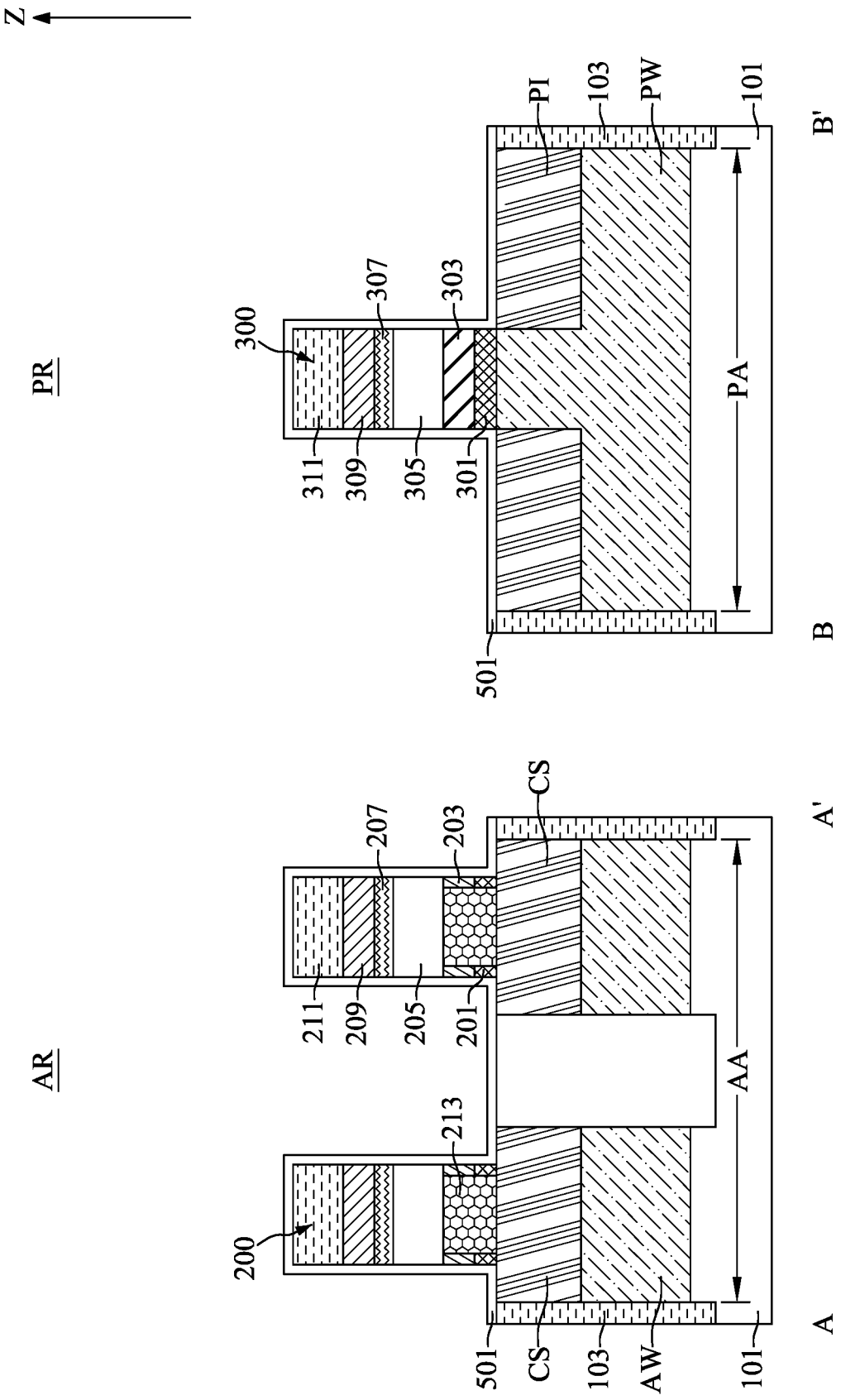

With reference to FIG. 24, the first liner layer 501 may be formed by, for example, atomic layer deposition, chemical vapor deposition, or other applicable deposition process. In some embodiments, the first liner layer 501 may be formed of, for example, silicon nitride, silicon nitride oxide, silicon oxynitride, or other applicable dielectric materials.

Figure 25:
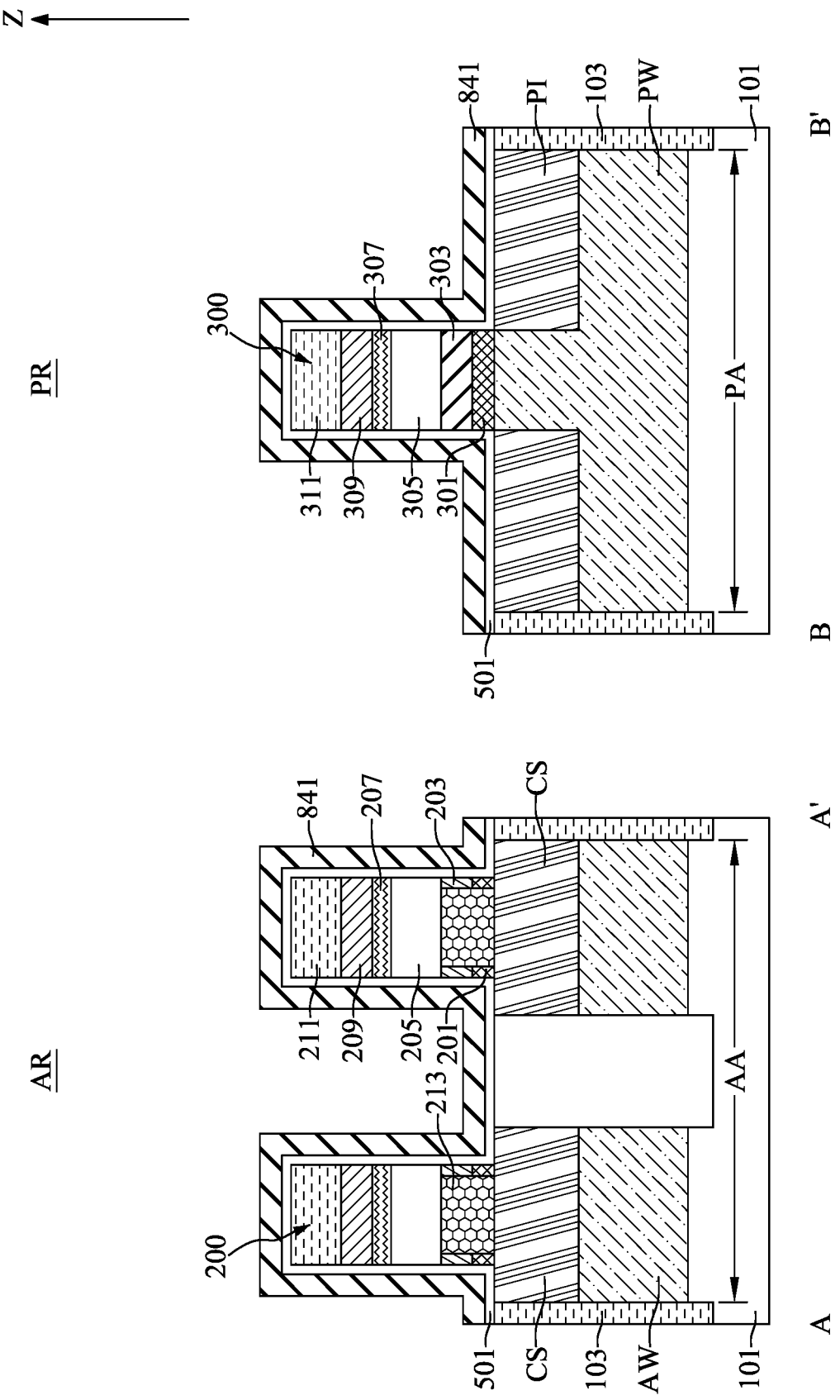

With reference to FIG. 25, a layer of first spacer material 841 may be conformally formed on the first liner layer 501. In some embodiments, the first spacer material 841 may include vanadium and a low-k material. For example, the first spacer material 841 may include one or more species of vanadium oxide. The species of vanadium oxide are according to $VO_x$, wherein x is in the range of about 1 to about 3. In some embodiments, the dielectric constant of the first spacer material 841 may be between about 1 and about 3.

In some embodiments, the layer of first spacer material 841 may be formed by, for example, chemical vapor deposition, plasma-enhanced chemical vapor deposition, atomic layer deposition, or plasma-enhanced atomic layer deposition. An atomic layer deposition process is theoretically self-limiting continuing until all available active sites on the substrate surface have been reacted. The atomic layer deposition process can be performed by time-domain or spatial atomic layer deposition.

In a time-domain process, the substrate (e.g., the first liner layer 501) are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial atomic layer deposition, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

In some embodiments, precursors of vanadium may be any vanadium-organometallic compound. Suitable vanadium precursors include, but are not limited to, vanadium oxytri-isopropoxide, vanadium oxytriethoxide, vanadium acetylacetonate, vanadium oxytrichloride, vanadium (III) chloride, vanadium (IV) chloride, and the like. The vanadium precursors may be delivered by a carrier gas such as argon, helenium, or hydrogen. In some embodiments, the reactant may comprise an oxygen source, a nitrogen source, a carbon source, a hydrogen source, a boron source, a silicon source or combinations thereof.

In some embodiments, the layer of first spacer material 841 may be doped. The layer of first spacer material 841 may include dopants in an amount in the range of 0 to 50 atomic % of the layer. The dopants include but are not limited to carbon, nitrogen, silicon, boron, and fluorine.

Figure 26:
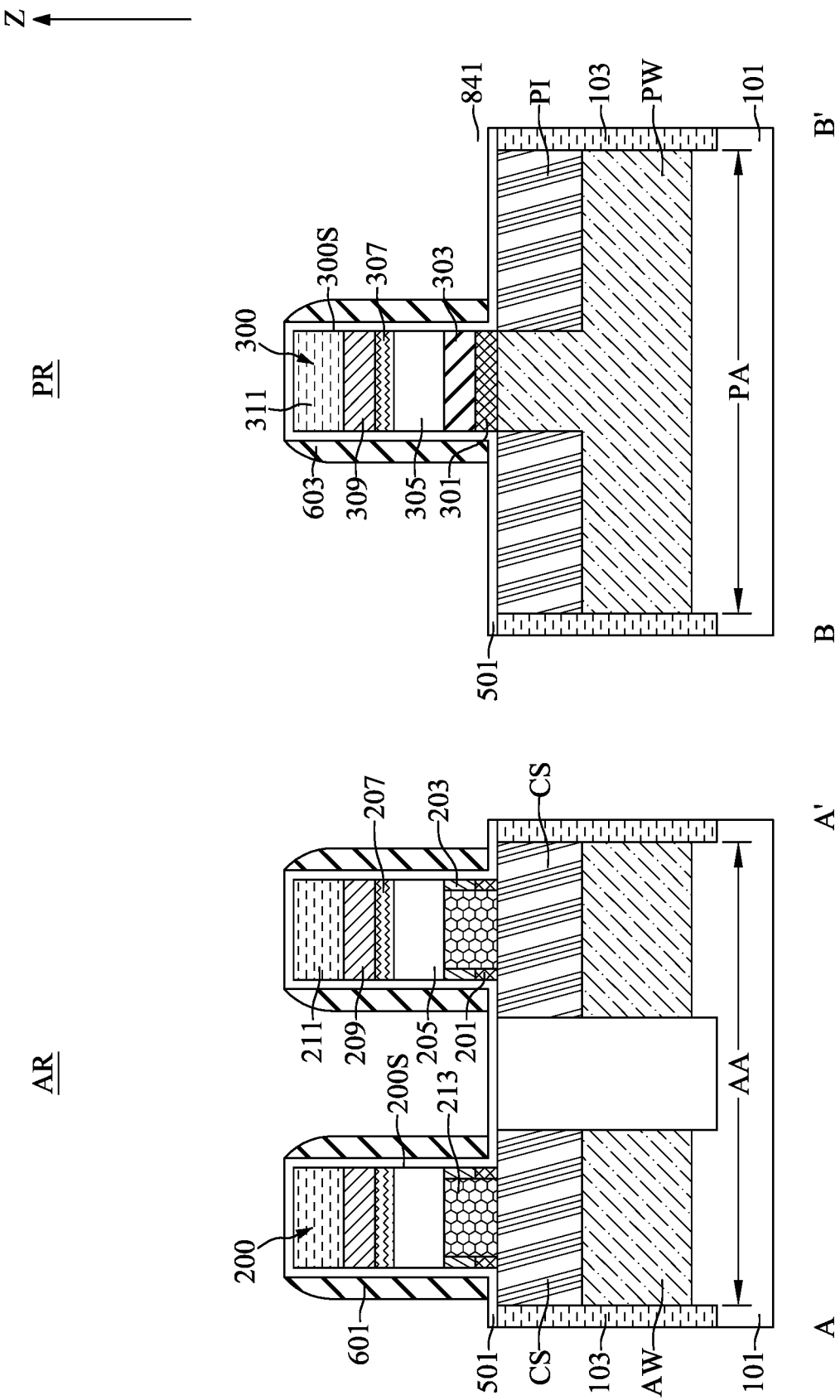

With reference to FIG. 26, a first spacer etch process may be performed to remove portions of the layer of first spacer material 841. The remaining first spacer material 841 may be referred to as the plurality of first bit line spacers 601 covering the sidewalls 200S of the bit line structure 200 and the plurality of first peripheral gate spacers 603 covering the sidewalls 300S of the peripheral gate structure 300. The first spacer etch process may be, for example, an anisotropic etch process such as reactive ion etching.

With reference to FIG. 1 and FIGS. 27 to 29, at step S25, a plurality of second bit line spacers 701 may be formed on the plurality of first bit line spacers 601, and a plurality of second peripheral gate spacers 703 may be formed on the plurality of first peripheral gate spacers 603.

Figure 27:
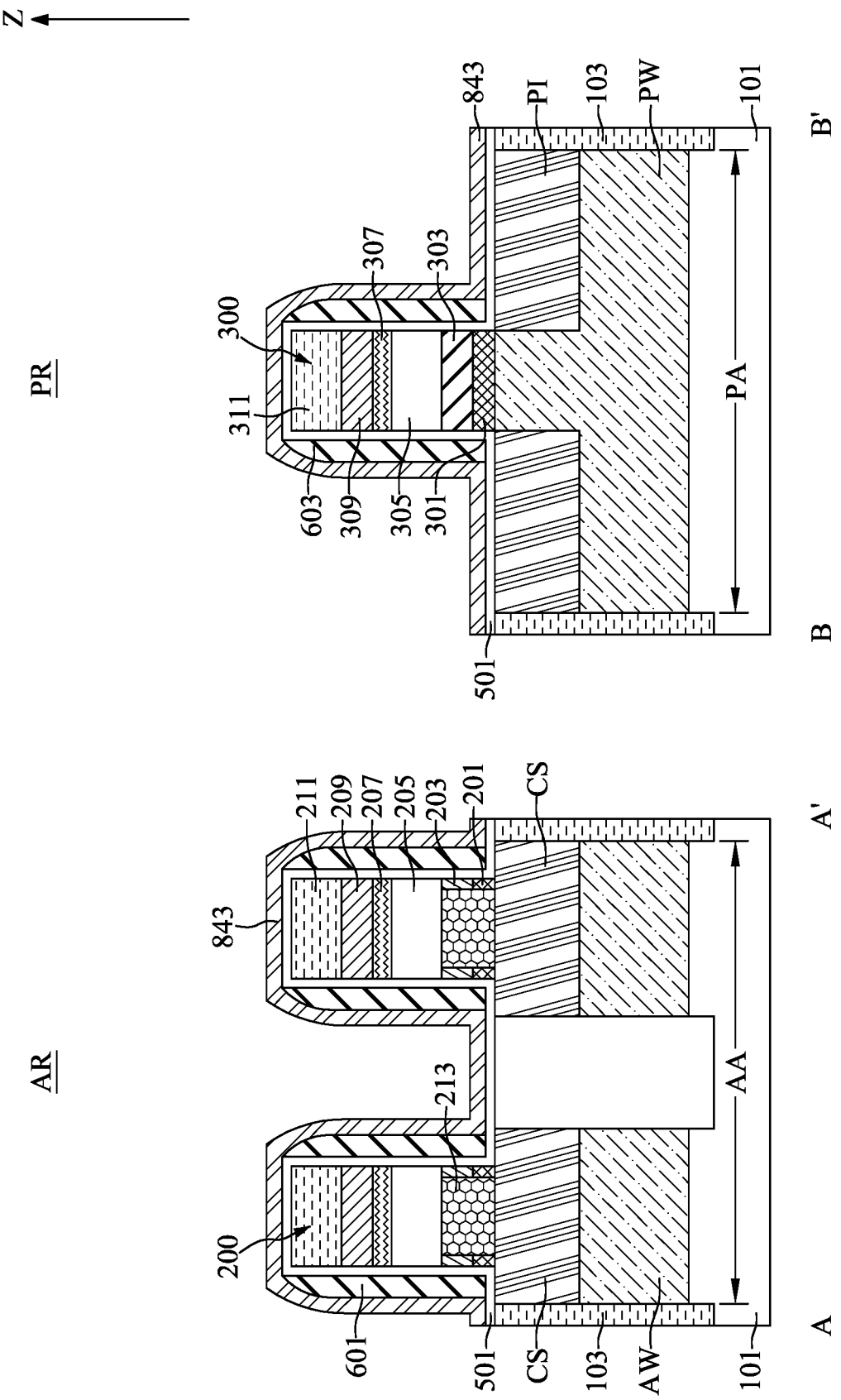

With reference to FIG. 27, a layer of second spacer material 843 may be conformally formed over the substrate 101. In some embodiments, the layer of second spacer material 843 may be formed by, for example, atomic layer deposition, chemical vapor deposition, or other applicable deposition process. In some embodiments, the second spacer material 843 may be, for example, silicon oxide, silicon nitride, silicon oxynitride, silicon nitride oxide, or other applicable insulating material.

Figure 28:
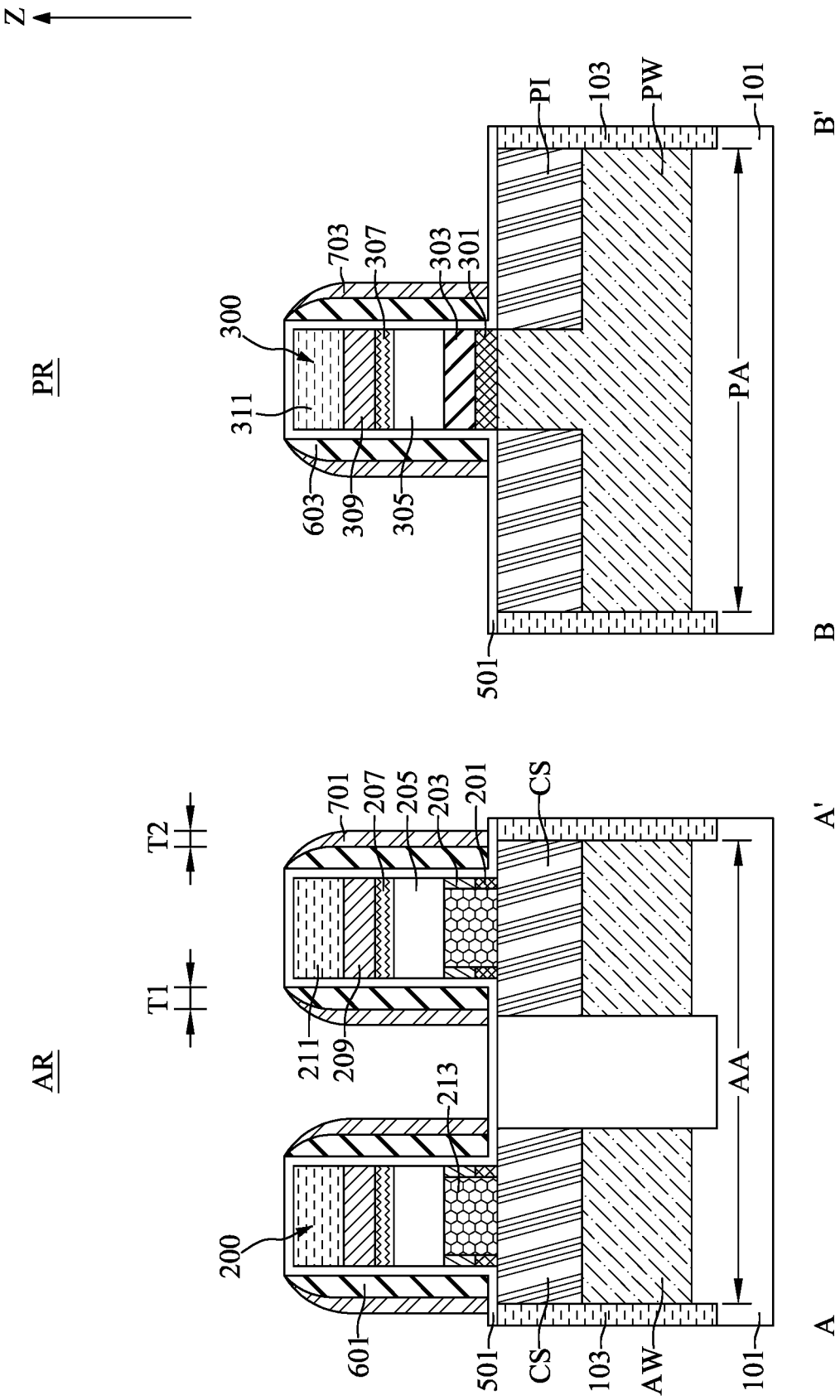

With reference to FIG. 28, a second spacer etch process may be performed to remove portions of the layer of second spacer material 843. The remaining second spacer material 843 may be referred to as the plurality of second bit line spacers 701 covering the plurality of first bit line spacers 601 and the plurality of second peripheral gate spacers 703 covering the plurality of first peripheral gate spacers 603. The second spacer etch process may be, for example, an anisotropic etch process such as reactive ion etching.

In some embodiments, the thickness T1 of the plurality of first bit line spacers 601 and the thickness T2 of the plurality of second bit line spacers 701 may be substantially the same. In some embodiments, the thickness T1 of the plurality of first bit line spacers 601 and the thickness T2 of the plurality of second bit line spacers 701 may be different. For example, the thickness T1 of the plurality of first bit line spacers 601 may be greater than or less than the thickness T2 of the plurality of second bit line spacers 701.

Figure 29:
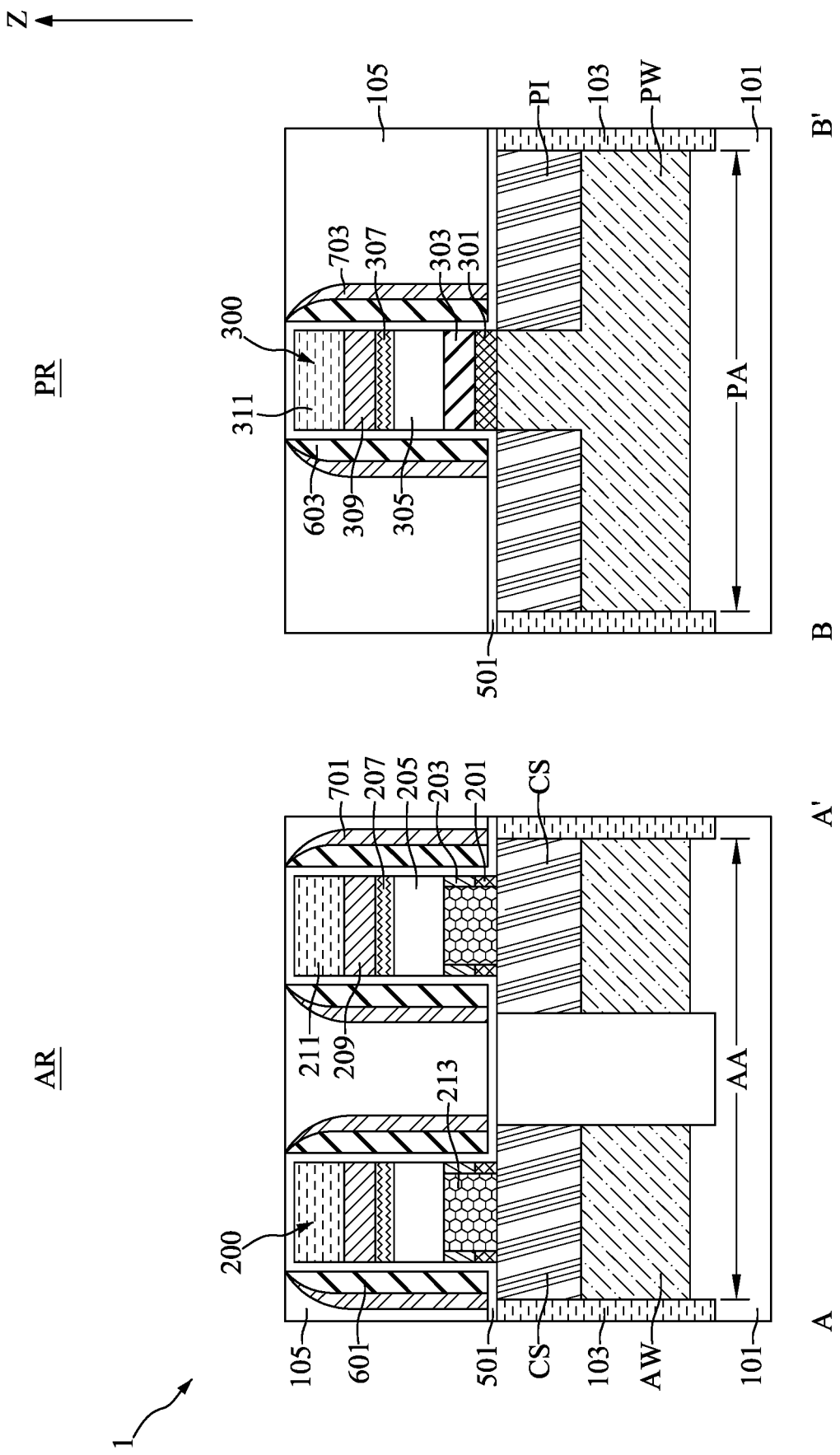

With reference to FIG. 29, an interlayer dielectric 105 may be formed over the substrate 101 to cover the bit line structure 200 and the peripheral gate structure 300. A planarization process, such as chemical mechanical polishing, may be performed to remove excess material and provide a substantially flat surface for subsequent processing steps. The interlayer dielectric 105 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the interlayer dielectric 105 may include a self-planarizing material such as a spin-on glass or a spin-on low-k dielectric material such as SiLK™. In some embodiments, the interlayer dielectric 105 may be formed by a deposition process including, for example, chemical vapor deposition, plasma enhanced chemical vapor deposition, evaporation, or spin-on coating.

One aspect of the present disclosure provides a semiconductor device including a substrate; a bit line structure positioned on the substrate; a plurality of first bit line spacers positioned on sidewalls of the bit line structure; a plurality of second bit line spacers positioned on the plurality of first bit line spacers. The plurality of first bit line spacers include one or more species of vanadium oxide. The plurality of second bit line spacers include silicon nitride, silicon nitride oxide, or silicon oxynitride.

Another aspect of the present disclosure provides a semiconductor device including a substrate including an array region and a peripheral region surrounding the array region; a bit line structure positioned on the array region; a peripheral gate structure positioned on the peripheral region; a plurality of first bit line spacers positioned on sidewalls of the bit line structure and a plurality of first peripheral gate spacers positioned on sidewalls of the peripheral gate structure; and a plurality of second bit line spacers positioned on the plurality of first bit line spacers and a plurality of second peripheral gate spacers positioned on the plurality of first peripheral gate spacers. The plurality of first bit line spacers and the plurality of first peripheral gate spacers include one or more species of vanadium oxide. The plurality of second bit line spacers and the plurality of second peripheral gate spacers include silicon nitride, silicon nitride oxide, or silicon oxynitride.

Another aspect of the present disclosure provides a method for fabricating a semiconductor device including providing a substrate including an array region and a peripheral region surrounding the array region; forming a bit line structure on the array region and forming a peripheral gate structure on the peripheral region; forming a plurality of first bit line spacers on sidewalls of the bit line structure and forming a plurality of first peripheral gate spacers on sidewalls of the peripheral gate structure; and forming a plurality of second bit line spacers on the plurality of first bit line spacers and forming a plurality of second peripheral gate spacers on the plurality of first peripheral gate spacers. The plurality of first bit line spacers and the plurality of first peripheral gate spacers include one or more species of vanadium oxide. The plurality of second bit line spacers and the plurality of second peripheral gate spacers include silicon nitride, silicon nitride oxide, or silicon oxynitride.

Due to the design of the semiconductor device of the present disclosure, the parasitic capacitance between adjacent bit line structures 200 may be reduced due to the employment of the plurality of first bit line spacers 601 containing vanadium. As a result, the performance of the semiconductor device 1 may be improved. In addition, layers of the bit line structure 200 and the layers of peripheral gate structure 300 may be concurrently formed to reduce the complexity and time for fabricating the semiconductor device 1. As a result, the cost of fabrication of the semiconductor device 1 may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a bit line structure positioned on the substrate;
a plurality of first bit line spacers positioned on sidewalls of the bit line structure;
a plurality of second bit line spacers positioned on the plurality of first bit line spacers;
wherein the plurality of first bit line spacers comprise one or more species of vanadium oxide;
wherein the plurality of second bit line spacers comprise silicon nitride, silicon nitride oxide, or silicon oxynitride;
wherein the species of vanadium oxide are according to $VO_x$, wherein x is in between about 1 and about 3;
wherein the plurality of first bit line spacers comprises dopants comprising carbon, nitrogen, silicon, boron, or fluorine;
wherein the bit line structure comprises:
a bit line bottom insulating layer positioned on the substrate and comprising silicon oxide;
a bit line dielectric layer positioned on the bit line bottom insulating layer and comprising a high dielectric constant material;
a bit line higher conductive layer positioned on the bit line dielectric layer and comprising tungsten, cobalt, zirconium, tantalum, titanium, aluminum, ruthenium, copper, metal carbides, metal nitrides, transition metal aluminides, or a combination thereof; and
a bit line capping layer positioned on the bit line higher conductive layer and comprising silicon nitride.

2. The semiconductor device of claim 1, wherein a dielectric constant of the plurality of first bit line spacers is between about 1 and about 3.

3. The semiconductor device of claim 1, further comprising a first liner layer positioned between the bit line structure and the plurality of first bit line spacers;
wherein the first liner layer comprises silicon nitride, silicon nitride oxide, or silicon oxynitride.

4. The semiconductor device of claim 3, further comprising a bit line lower conductive layer positioned between the bit line dielectric layer and the bit line higher conductive layer;
wherein the bit line lower conductive layer comprises polycrystalline silicon.

5. The semiconductor device of claim 4, further comprising a bit line middle conductive layer positioned between the bit line higher conductive layer and the bit line lower conductive layer;
wherein the bit line middle conductive layer comprises titanium silicide, nickel silicide, nickel platinum silicide, tantalum silicide, or cobalt silicide.

6. A semiconductor device, comprising:
a substrate comprising an array region and a peripheral region surrounding the array region;
a bit line structure positioned on the array region;
a peripheral gate structure positioned on the peripheral region;
a plurality of first bit line spacers positioned on sidewalls of the bit line structure and a plurality of first peripheral gate spacers positioned on sidewalls of the peripheral gate structure; and
a plurality of second bit line spacers positioned on the plurality of first bit line spacers and a plurality of second peripheral gate spacers positioned on the plurality of first peripheral gate spacers;
wherein the plurality of first bit line spacers and the plurality of first peripheral gate spacers comprise one or more species of vanadium oxide;
wherein the plurality of second bit line spacers and the plurality of second peripheral gate spacers comprise silicon nitride, silicon nitride oxide, or silicon oxynitride;
wherein the species of vanadium oxide are according to $VO_x$, wherein x is in between about 1 and about 3;
wherein a dielectric constant of the plurality of first bit line spacers is between about 1 and about 3;
wherein the bit line structure comprises:
a bit line bottom insulating layer positioned on the array region and comprising silicon oxide;
a bit line dielectric layer positioned on the bit line bottom insulating layer and comprising a high dielectric constant material;
a bit line higher conductive layer positioned on the bit line dielectric layer and comprising tungsten, cobalt, zirconium, tantalum, titanium, aluminum, ruthenium, copper, metal carbides, metal nitrides, transition metal aluminides, or a combination thereof; and
a bit line capping layer positioned on the bit line higher conductive layer and comprising silicon nitride.

7. The semiconductor device of claim 6, wherein the peripheral gate structure comprises:
a peripheral gate bottom insulating layer positioned on the peripheral region and comprising silicon oxide;
a peripheral gate conductive layer positioned on the peripheral gate bottom insulating layer and comprising polycrystalline silicon;
a peripheral gate higher conductive layer positioned on the peripheral gate conductive layer and comprising tungsten, cobalt, zirconium, tantalum, titanium, aluminum, ruthenium, copper, metal carbides, metal nitrides, transition metal aluminides, or a combination thereof; and
a peripheral gate capping layer positioned on the peripheral gate higher conductive layer and comprising silicon nitride.

8. The semiconductor device of claim 7, wherein the bit line dielectric layer and the peripheral gate conductive layer are at a same vertical level.

9. The semiconductor device of claim 8, wherein the plurality of first bit line spacers comprises dopants comprising carbon, nitrogen, silicon, boron, or fluorine.

10. The semiconductor device of claim 8, further comprising a first liner layer positioned between the bit line structure and the plurality of first bit line spacers and positioned between the peripheral gate structure and the plurality of first peripheral gate spacers;
wherein the first liner layer comprises silicon nitride, silicon nitride oxide, or silicon oxynitride.

11. The semiconductor device of claim 10, further comprising a bit line lower conductive layer positioned between the bit line dielectric layer and the bit line higher conductive layer;
wherein the bit line lower conductive layer comprises polycrystalline silicon.

12. The semiconductor device of claim 11, further comprising a bit line middle conductive layer positioned between the bit line higher conductive layer and the bit line lower conductive layer;
wherein the bit line middle conductive layer comprises titanium silicide, nickel silicide, nickel platinum silicide, tantalum silicide, or cobalt silicide.

13. The semiconductor device of claim 12, further comprising a bit line contact positioned along the bit line dielectric layer and the bit line bottom insulating layer and contacting the bit line lower conductive layer and the array region, and a common source region positioned in the array region and under the bit line contact.

14. A method for fabricating a semiconductor device, comprising:
providing a substrate comprising an array region and a peripheral region surrounding the array region;
forming a bit line structure on the array region and forming a peripheral gate structure on the peripheral region;
forming a plurality of first bit line spacers on sidewalls of the bit line structure and forming a plurality of first peripheral gate spacers on sidewalls of the peripheral gate structure; and
forming a plurality of second bit line spacers on the plurality of first bit line spacers and forming a plurality of second peripheral gate spacers on the plurality of first peripheral gate spacers;
wherein the plurality of first bit line spacers and the plurality of first peripheral gate spacers comprise one or more species of vanadium oxide;
wherein the plurality of second bit line spacers and the plurality of second peripheral gate spacers comprise silicon nitride, silicon nitride oxide, or silicon oxynitride;
wherein the species of vanadium oxide are according to $VO_x$, wherein x is in between about 1 and about 3;
wherein a dielectric constant of the plurality of first bit line spacers is between about 1 and about 3;
wherein the bit line structure comprises:
a bit line bottom insulating layer on the array region and comprising silicon oxide;

a bit line dielectric layer on the bit line bottom insulating layer and comprising a high dielectric constant material;

a bit line higher conductive layer on the bit line dielectric layer and comprising tungsten, cobalt, zirconium, tantalum, titanium, aluminum, ruthenium, copper, metal carbides, metal nitrides, transition metal aluminides, or a combination thereof; and a bit line capping layer on the bit line higher conductive layer and comprising silicon nitride.

15. The method for fabricating the semiconductor device of claim 14, wherein the peripheral gate structure comprises:

a peripheral gate bottom insulating layer on the peripheral region and comprising silicon oxide;

a peripheral gate conductive layer on the peripheral gate bottom insulating layer and comprising polycrystalline silicon;

a peripheral gate higher conductive layer on the peripheral gate conductive layer and comprising tungsten, cobalt, zirconium, tantalum, titanium, aluminum, ruthenium, copper, metal carbides, metal nitrides, transition metal aluminides, or a combination thereof; and a peripheral gate capping layer on the peripheral gate higher conductive layer and comprising silicon nitride.

16. The method for fabricating the semiconductor device of claim 15, wherein the bit line dielectric layer and the peripheral gate conductive layer are formed at a same vertical level; wherein the plurality of first bit line spacers comprises dopants comprising carbon, nitrogen, silicon, boron, or fluorine.

17. The method for fabricating the semiconductor device of claim 16, further comprising:

forming a first liner layer between the bit line structure and the plurality of first bit line spacers and between the peripheral gate structure and the plurality of first peripheral gate spacers;

forming a bit line middle conductive layer between the bit line higher conductive layer and the bit line lower conductive layer; and forming a bit line contact along the bit line dielectric layer and the bit line bottom insulating layer;

wherein the first liner layer comprises silicon nitride, silicon nitride oxide, or silicon oxynitride;

wherein the bit line middle conductive layer comprises titanium silicide, nickel silicide, nickel platinum silicide, tantalum silicide, or cobalt silicide.

* * * * *